(12) United States Patent
Ohigashi et al.

(10) Patent No.: US 8,969,490 B2
(45) Date of Patent: Mar. 3, 2015

(54) EPOXY RESIN COMPOSITION, RESIN SHEET, PREPREG, MULTILAYER PRINTED WIRING BOARD AND SEMICONDUCTOR DEVICE

(75) Inventors: Noriyuki Ohigashi, Tokyo (JP); Michio Kimura, Tokyo (JP); Haruo Murakami, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 630 days.

(21) Appl. No.: 12/921,401

(22) PCT Filed: Mar. 24, 2009

(86) PCT No.: PCT/JP2009/055844
§ 371 (c)(1),
(2), (4) Date: Sep. 8, 2010

(87) PCT Pub. No.: WO2009/119598
PCT Pub. Date: Oct. 1, 2009

(65) Prior Publication Data
US 2011/0007489 A1 Jan. 13, 2011

(30) Foreign Application Priority Data

Mar. 25, 2008 (JP) ................................. 2008-077200
Sep. 24, 2008 (JP) ................................. 2008-244126

(51) Int. Cl.
*B32B 17/10* (2006.01)
(Continued)

(52) U.S. Cl.
CPC .......... *H05K 1/0326* (2013.01); *C08G 59/3218* (2013.01); *C08G 59/5073* (2013.01); *C08G 2650/56* (2013.01); *C08J 5/18* (2013.01); *C08J 5/24* (2013.01); *C08J 2363/00* (2013.01); *C08K 3/0033* (2013.01); *C08K 5/3445* (2013.01); *C08L 63/00* (2013.01); *C08L 71/00* (2013.01); *H05K 3/4626* (2013.01)
USPC .............. 525/471; 428/417; 156/60; 361/783

(58) Field of Classification Search
None
See application file for complete search history.

(56) References Cited

FOREIGN PATENT DOCUMENTS

| JP | 07-106767 | | 4/1995 |
|----|-----------|---|--------|
| JP | 09-100393 | | 4/1997 |
| JP | 2001-131501 | * | 5/2001 |
| JP | 3001-131501 | * | 5/2001 |
| JP | 2002-128868 | | 5/2002 |
| JP | 2003-342350 | | 2/2003 |
| JP | 2005-240019 | | 9/2005 |
| JP | 2005-244150 | | 9/2005 |

(Continued)

OTHER PUBLICATIONS

International Search Report for International Application No. PCT/JP2009/055844, May 19, 2009.

*Primary Examiner* — Jennifer Chriss
*Assistant Examiner* — Camie Thompson
(74) *Attorney, Agent, or Firm* — Ditthavong & Steiner, P.C.

(57) ABSTRACT

An object of the present invention is to provide an epoxy resin composition that provides, when used for an insulation layer of a multilayer printed wiring board, a multilayer printed wiring board which is excellent in plating adhesion, heat resistance and moisture resistance reliability and capable of forming fine wiring. Another object of the present invention is to provide a resin sheet, a prepreg, a method for producing a multilayer printed wiring board, a multilayer printed wiring board and a semiconductor device.

These objects are achieved by an epoxy resin composition comprising (A) an epoxy resin, (B) a phenoxy resin having a specific bisphenol acetophenone structure and (C) a curing agent, wherein the content of the phenoxy resin (B) is 10 to 30% by weight of the total solid content of the resin composition.

20 Claims, 1 Drawing Sheet

(51) Int. Cl.
*B29C 65/00* (2006.01)
*C08F 283/00* (2006.01)
*H05K 7/00* (2006.01)
*H05K 1/03* (2006.01)
*C08G 59/32* (2006.01)
*C08G 59/50* (2006.01)
*C08J 5/18* (2006.01)
*C08J 5/24* (2006.01)
*C08L 63/00* (2006.01)
*C08L 71/00* (2006.01)
*C08K 3/00* (2006.01)
*C08K 5/3445* (2006.01)
*H05K 3/46* (2006.01)

(56) References Cited

FOREIGN PATENT DOCUMENTS

| | | |
|---|---|---|
| JP | 2005-320477 | 11/2005 |
| JP | 2007-087982 * | 4/2007 |
| JP | 2007-254709 | 10/2007 |
| JP | 2007-254710 | 10/2007 |
| JP | 2008-007575 | 1/2008 |
| JP | 2008-074929 | 4/2008 |
| WO | WO 03/099952 A1 | 12/2003 |
| WO | WO 2004/031257 | 4/2004 |
| WO | WO 2007/129662 | 11/2007 |

\* cited by examiner

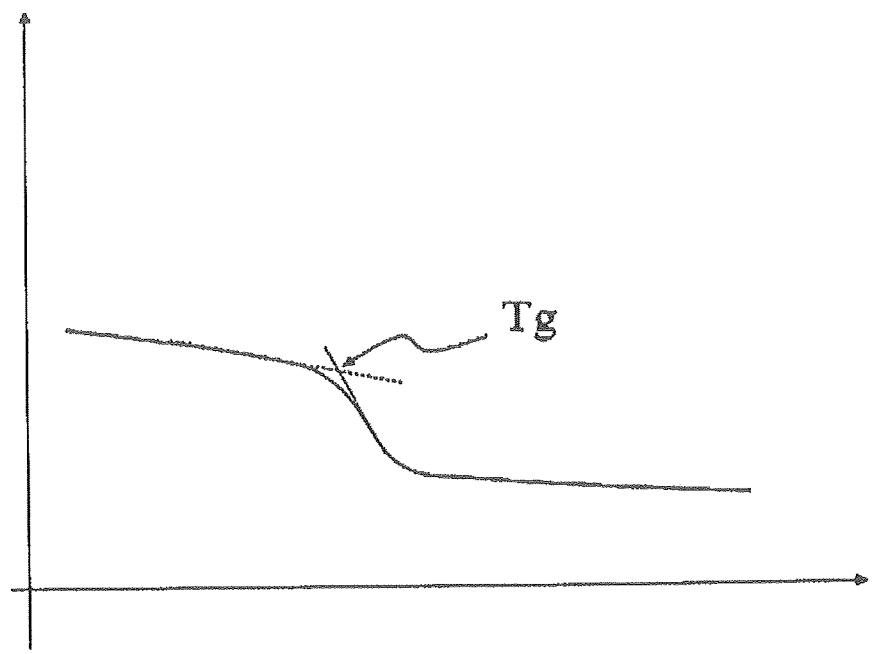

EPOXY RESIN COMPOSITION, RESIN SHEET, PREPREG, MULTILAYER PRINTED WIRING BOARD AND SEMICONDUCTOR DEVICE

TECHNICAL FIELD

The present invention relates to an epoxy resin composition, a resin sheet, a prepreg, a multilayer printed wiring board and a semiconductor device.

BACKGROUND ART

With the demand for sophisticated electronic instruments in recent years, there have been developed high-density integration and high-density mounting of electronic components. Because of this, printed wiring boards designed for high-density mounting and for use in such instruments are increasingly downsized and provided with higher density. To meet the demand for a higher-density printed wiring board, a multilayer printed wiring board produced by the build-up method is employed in many cases (see Patent Literature 1, for example).

Normally, the multilayer printed wiring board produced by the build-up method is formed by laminating conductor circuit layers and insulation layers comprising a resin composition and having a thickness of 100 μm or less, and molding the same. As the method for connecting between conductor circuit layers, there may be mentioned via hole formation by a laser method, photolithography method or the like, instead of conventional drilling. These methods realize higher-density by providing small via holes freely, and for each of various build-up methods corresponding to each method, a resin sheet provided with a substrate is proposed.

Furthermore, to obtain higher density, it is necessary to form a fine circuit. As a technique to achieve it, a semi-additive method is widely known. The semi-additive method is a method for forming a conductive circuit on an insulation layer in such a manner that, following surface roughening of an insulation layer, electroless plating is performed thereon so as to function as a base coat, and after a non-circuit forming area is protected with a plating resist, copper is deposited on a circuit forming area by electroplating, followed by removal of the resist and soft etching.

Studies are provided into the production of a multilayer printed wiring board by the semi-additive method; however, there are problems such as a decrease in plating adhesion which occurs during production process, a decrease in heat resistance or moisture resistance reliability attributed to the type of the insulation resin layer used.

For example, in the case of using a phenoxy resin having a bisphenol acetophenone structure for an insulation layer (e.g., Patent Literature 2) or in the case of using a cyanate ester resin for an insulation layer (Patent Literature 3), there is a problem with plating adhesion, so that such insulation layers are not applicable to the semi additive method.

In the case of using an insulation resin layer comprising an epoxy resin, a specific phenolic curing agent, a phenoxy resin and rubber particles (e.g., Patent Literature 4), relatively good plating adhesion can be obtained; however, heat resistance or moisture resistance reliability is not enough. Because of this, application of such an insulation resin layer into multilayer printed wiring boards that are required to have high reliability, is difficult.

Currently, in the case of using a resin sheet in a multilayer printed wiring board, in order to minimize warpage of the board, there are studied decreasing the expansion characteristics of an insulation resin layer, (Patent Literature 5), surface smoothness (Patent Literature 6), a low surface roughness (Ra) of 0.4 μm or less which makes the surface of an insulation resin layer resistant to fine wiring process, and improvement of plating adhesion (Patent Literatures 4, 7, 8, 9 and 10).

However, none of them can solve all of the problems. In the future, especially since the width of circuit conductors and the width of the gap between circuit conductors will be small, there would be a serious problem with insulation reliability of fine circuits. Also disclosed is a case of using a prepreg in an insulation resin layer to obtain low thermal expansion characteristics (Patent Literatures 9 and 10); however, it cannot satisfy low thermal expansion characteristics, formation of fine wiring and insulation reliability of fine circuits.

Patent Literature 1: Japanese Patent Application Laid-Open (JP-A) No. H07-106767
Patent Literature 2: JP-A No. 2003-342350
Patent Literature 3: JP-A No. H09-100393
Patent Literature 4: JP-A No. 2007-254709
Patent Literature 5: Domestic Re-publication of PCT International Publication for Patent Application No. 03/099952
Patent Literature 6: JP-A No. 2005-240019
Patent Literature 7: JP-A No. 2005-244150
Patent Literature 8: JP-A No. 2007-254710
Patent Literature 9: JP-A No. 2008-007575
Patent Literature 10: JP-A No, 2008-074929

SUMMARY OF INVENTION

Technical Problem

An object of the present invention is to provide an epoxy resin composition that provides, when used for an insulation layer of a multilayer printed wiring board, a multilayer printed wiring board which is excellent in plating adhesion, heat resistance and moisture resistance reliability and capable of forming advanced fine wiring. Another object of the present invention is to provide a resin sheet, a prepreg, a method for producing a multilayer printed wiring board, a multilayer printed wiring board and a semiconductor device.

Solution to Problem

These objects are achieved by the following present invention [1] to [19].

[1] An epoxy resin composition comprising: (A) an epoxy resin, (B) a phenoxy resin having a bisphenol acetophenone structure represented by the following formula (1) and (C) a curing agent, wherein the content of the phenoxy resin (B) is 10 to 30% by weight of the total solid content of the resin composition:

[Chemical formula 1]

Formula (1)

$$\begin{array}{c}\text{structure with two aromatic rings bearing } R_1 \text{ substituents, connected through a central carbon bearing } R_3 \text{ and a phenyl group with } (R_2)_m \text{ substituents}\end{array}$$

wherein $R_1$s may be the same or different and are each a group selected from a hydrogen atom, a hydrocarbon group having 1 to 10 carbon atoms, and halogen; $R_2$ is a group selected from a hydrogen atom, a hydrocarbon group having 1 to 10 carbon atoms, and halogen; $R_3$ is a hydrogen atom or a hydrocarbon group having 1 to 10 carbon atoms; and m is an integer of 0 to 5.

[2] The epoxy resin composition according to [1], further comprising (D) an inorganic filler.

[3] The epoxy resin composition according to [1] or [2], further comprising (E) a cyanate resin and/or prepolymer thereof.

[4] The epoxy resin composition according to any of [1] to [3], wherein the epoxy resin (A) is a novolac-type epoxy resin having a condensed ring aromatic hydrocarbon structure.

[5] The epoxy resin composition according to any of [1] to [4], comprising (A1) a novolac-type epoxy resin having a condensed ring aromatic hydrocarbon structure, (B) the phenoxy resin having a bisphenol acetophenone structure represented by the above formula (1), (C) the curing agent, (D) the inorganic filler and (E) the cyanate resin and/or prepolymer thereof, wherein the content of the phenoxy resin (B) is 10 to 30% by weight of the total solid content of the resin composition.

[6] The epoxy resin composition according to any of [1] to [5], comprising an imidazole compound as the curing agent (C).

[7] The epoxy resin composition according to any of [1] to [6], further comprising a poly(meth)acrylic acid ester having a weight average molecular weight of $1.0 \times 10^3$ to $1.0 \times 10^5$.

[8] The epoxy resin composition according to any of [1] to [7], wherein the phenoxy resin (B) having a bisphenol acetophenone structure represented by the above formula (1) further has a biphenyl structure.

[9] The epoxy resin composition according to any of [1] to [8], wherein the phenoxy resin (B) having a bisphenol acetophenone structure represented by the above formula (1) has a glass transition temperature of 120° C. or more.

[10] The epoxy resin composition according to any of [2] to [9], wherein the inorganic filler (D) has a particle diameter of 0.2 μm to 5 μm.

[11] The epoxy resin composition according to any of [2] to [10], wherein the inorganic filler (D) comprises silica and/or aluminum hydroxide.

[12] The epoxy resin composition according to any of [1] to [11], wherein, in the total solid content of the resin composition, the content of the epoxy resin (A) is 5 to 80% by weight, the content of the phenoxy resin (B) is 10 to 30% by weight, and the content of the curing agent (C) is 0.01 to 25% by weight.

[13] The epoxy resin composition according to any of [2] to [12], wherein, in the total solid content of the resin composition, the content of the epoxy resin (A) is 5 to 60% by weight, the content of the phenoxy resin (B) is 10 to 30% by weight, the content of the curing agent (C) is 0.01 to 15% by weight, and the content of the inorganic filler (D) is 10 to 75% by weight.

[14] The epoxy resin composition according to any of [5] to [13], wherein, in the total solid content of the resin composition, the content of the novolac-type epoxy resin (A1) having a condensed ring aromatic hydrocarbon structure is 10 to 60% by weight, the content of the phenoxy resin (B) is 10 to 30% by weight; the content of the curing agent (C) is 0.01 to 5% by weight; the content of the inorganic filler (D) is 10 to 70% by weight; and the content of the cyanate resin and/or prepolymer thereof (E) is 5 to 60% by weight.

[15] A resin sheet comprising a substrate and a resin layer comprising the epoxy resin composition defined in any of [1] to [14], wherein the resin layer is formed on the substrate.

[16] A prepreg comprising a glass fiber substrate and the epoxy resin composition defined in any of [1] to [14], wherein the glass fiber substrate is impregnated with the epoxy resin composition.

[17] A method for producing a multilayer printed wiring board comprising the steps of successively laminating the resin sheets defined in [15] on a surface of an inner layer circuit board, on which an inner layer circuit pattern is formed, and forming a conductor circuit layer by a semi-additive process.

[18] A multilayer printed wiring board formed by laminating the resin sheets defined in [15] or the prepregs defined in [16] on one or both surfaces of an inner layer circuit board and hot-pressing the same.

[19] A semiconductor device formed by mounting a semiconductor element on the multilayer printed wiring board defined in [18].

Advantageous Effects of Invention

According to the present invention, because the resin composition of the present invention is a resin composition obtained by combining the epoxy resin (A), the phenoxy resin (B) having a bisphenol acetophenone structure represented by the above formula (1) and the curing agent (C), all of which are specified above, and especially because a specific amount of the above-specified phenoxy resin (B) is contained in the total solid content of the resin composition, there is an advantageous effect such that when the resin composition is used for an insulation layer of a multilayer printed wiring board, a multilayer printed wiring board which is excellent in plating adhesion, heat resistance and moisture resistance reliability and capable of forming advanced fine wiring, is produced. Also, according to the present invention, the resin composition has such a high thermal shock resistance that prevents a conductor circuit layer from peeling or cracking in a thermal shock test such as a cold heat cycle test.

By using the resin sheet of the present invention for the insulation layer of a multilayer printed wiring board, the resulting multilayer printed wiring board is excellent in fine wiring workability, adhesion between the insulation resin layer and conductor circuits, and insulation reliability.

Also, the present invention can be suitably applied to a multilayer printed wiring board called package substrate, which is especially used for a flip-chip package, system in a package (SiP), package on a package (PoP), etc. The package substrate functions as an intermediary to transfer signals between a motherboard and a semiconductor element, so that the substrate is especially required to be able to form fine circuits densely and to have high reliability. By using the resin sheet of the present invention, it becomes possible to form fine circuits densely, which is required of a package substrate.

Furthermore, it is possible to produce multilayer printed wiring boards with a high yield by the steps of successively laminating the resin sheets of the present invention on a surface of an inner layer circuit board, on which an inner layer circuit pattern is formed, and forming a conductor circuit layer by a semi-additive process.

The semiconductor device formed by mounting a semiconductor element on a package substrate which is produced by using the resin sheet of the present invention, is especially excellent in reliability.

BRIEF DESCRIPTION OF DRAWINGS

FIG. 1 is a schematic view showing the method for determining a glass transition temperature in the present invention.

DESCRIPTION OF EMBODIMENTS

Hereinafter, the epoxy resin composition, resin sheet, prepreg, multilayer printed wiring board and semiconductor device of the present invention will be described in detail.

The epoxy resin composition of the present invention comprises (A) an epoxy resin, (B) a phenoxy resin having a bisphenol acetophenone structure represented by the following formula (1) and (C) a curing agent, wherein the content of the phenoxy resin (B) is 10 to 30% by weight of the total solid content of the resin composition:

[Chemical formula 2]

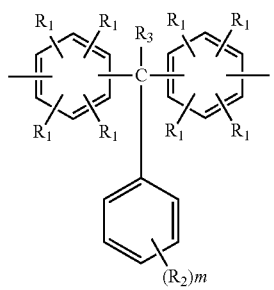

Formula (1)

wherein $R_1$s may be the same or different and are each a group selected from a hydrogen atom, a hydrocarbon group having 1 to 10 carbon atoms, and halogen; $R_2$ is a group selected from a hydrogen atom, a hydrocarbon group having 1 to 10 carbon atoms, and halogen; $R_3$ is a hydrogen atom or a hydrocarbon group having 1 to 10 carbon atoms; and m is an integer of 0 to 5.

Because the epoxy resin composition of the present invention is a resin composition obtained by combining the epoxy resin (A), the phenoxy resin (B) having a bisphenol acetophenone structure represented by the above formula (1) and the curing agent (C), all of which are specified above, and especially because a specific amount of the above-specified phenoxy resin (B) is contained in the total solid content of the resin composition, when the resin composition is used for an insulation layer of a multilayer printed wiring board, a multilayer printed wiring board which is excellent in plating adhesion, heat resistance and moisture resistance reliability and capable of forming advanced fine wiring is produced.

The epoxy resin composition of the present invention contains the epoxy resin (A), the phenoxy resin (B) having a bisphenol acetophenone structure represented by the above formula (1) and the curing agent (C) as essential components, and it may further contain other components. Hereinafter, each of the components will be described in order.

The epoxy resin (A) used in the present invention is not particularly limited. For example, there may be used well-known and commonly-used ones solely or in combination of two or more, such as a bisphenol A-type epoxy resin, a bisphenol F-type epoxy resin, a bisphenol S-type epoxy resin, a phenol novolac-type epoxy resin, an alkylphenol novolac-type epoxy resin, a biphenyl-type epoxy resin, a naphthalene-type epoxy resin, a dicyclopentadiene-type epoxy resin, epoxidized condensation products of phenols and aromatic aldehydes having a phenolic hydroxyl group, a triglycidyl isocyanurate and an alicyclic epoxy resin. The epoxy resin composition may contain a monofunctional epoxy resin as a reactive diluent. Among them, preferred are a phenol novolac-type epoxy resin, an alkylphenol novolac-type epoxy resin, a biphenyl-type epoxy resin and a naphthalene-type epoxy resin. By applying these, the flame resistance and hygroscopic solder heat resistance of the epoxy resin composition can be improved.

As the epoxy resin used in the present invention, (A1) a novolac-type epoxy resin having a condensed ring aromatic hydrocarbon structure is especially preferred. The novolac-type epoxy resin (A1) having a condensed ring aromatic hydrocarbon structure is a novolac-type epoxy resin having a condensed ring aromatic hydrocarbon structure such as naphthalene, anthracene, phenanthrene, tetracene, chrysene, pyrene, triphenylene, tetraphene, etc. The novolac-type epoxy resin (A1) having a condensed ring aromatic hydrocarbon structure has excellent low thermal expansion characteristics since aromatic rings thereof can be arranged regularly. Also, the novolac-type epoxy resin (A1) is excellent in heat resistance because it has a high glass transition temperature. Moreover, compared with conventional novolac-type epoxies, the novolac-type epoxy resin (A1) is excellent in flame resistance because repeating structures thereof have a large molecular weight. As a result, when mixed with a cyanate resin, the novolac-type epoxy resin (A1) improves a weak point of cyanate resin, which is brittleness. Accordingly, when used in combination with (E) a cyanate resin and/or prepolymer thereof, which will be described below, the epoxy resin composition is provided with a higher glass transition temperature, thereby obtaining excellent mounting reliability that deals with lead-free.

The novolac-type epoxy resin (A1) having a condensed ring aromatic hydrocarbon structure is an epoxidized novolac-type phenolic resin synthesized from a phenolic compound, a formaldehyde compound and a condensed-ring aromatic hydrocarbon compound.

The phenolic compound is not particularly limited, and examples thereof include phenol; cresols such as, o-cresol, m-cresol and p-cresol; xylenols such as 2,3-xylenol, 2,4-xylenol, 2,5-xylenol, 2,6-xylenol, 3,4-xylenol and 3,5-xylenol; trimethylphenols such as 2,3,5-trimethylphenol; ethylphenols such as o-ethylphenol, m-ethylphenol and p-ethylphenol; alkylphenols such as isopropylphenol, butylphenol and t-butylphenol; naphthalenediols such as o-phenylphenol, m-phenylphenol, p-phenylphenol, catechol, 1,5-dihydroxynaphthalene, 1,6-dihydroxynaphthalene and 2,7-dihydroxynaphthalene; polyhydric phenols such as resorcin, catechol, hydroquinone, pyrogallol and phloroglucin; and alkyl polyhydric phenols such as alkylresorcin, alkylcatechol and alkylhydroquinone. Among them, phenol is preferred in terms of costs and effects on degradation reaction.

The aldehyde compound is not particularly limited, and examples thereof include formaldehyde, paraformaldehyde, trioxane, acetaldehyde, propionaldehyde, polyoxymethylene, chloral, hexamethylenetetramine, furfural, glyoxal, n-butyraldehyde, caproaldehyde, allylaldehyde, benzaldehyde, crotonaldehyde, acrolein, tetraoxymethylene, phenylacetaldehyde, o-tolualdehyde, salicylaldehyde, dihydroxybenzaldehyde, trihydroxybenzaldehyde and 4-hydroxy-3-methoxyaldehyde and paraformaldehyde.

The condensed-ring aromatic hydrocarbon compound is not particularly limited, and examples thereof include naphthalene derivatives such as methoxynaphthalene and butoxynaphthalene, anthracene derivatives such as methoxyanthracene, phenanthrene derivatives such as methoxyphenanthrene, other tetracene derivatives, chrysene derivatives, pyrene derivatives, a triphenylene derivative, and tetraphene derivatives.

The novolac-type epoxy resin (A1) having a condensed ring aromatic hydrocarbon structure is not particularly limited, and examples thereof include methoxynaphthalene-modified ortho-cresol novolac epoxy, butoxynaphthalene-modified meth(para)cresol novolac epoxy and methoxynaphthalene-modified novolac epoxy. Among them, preferred is a novolac-type epoxy resin (A1) having a condensed ring aromatic hydrocarbon structure represented by the following formula (2):

[Chemical formula 3]

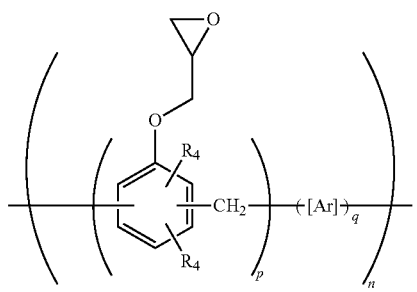

Formula (2)

wherein Ar is a condensed ring aromatic hydrocarbon group and selected from the following formulae (3); $R_4$s may be the same or different and are each a group selected from a hydrogen atom, a hydrocarbon group having 1 to 10 carbon atoms, and organic groups including a halogen, an aryl group such as a phenyl group and a benzyl group, and glycidyl ether; n, p and q are each an integer of 1 or more; and the value of p and q may be the same or different in each repeating unit:

[Chemical formula 4]

Formulae (3)

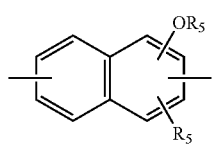 (Ar1)

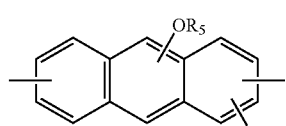 (Ar2)

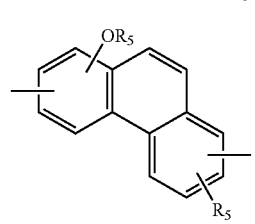 (Ar3)

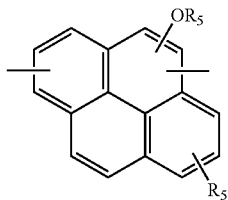 (Ar4)

wherein Ar is a structure represented by one or more of (Ar1) to (Ar4); and $R_5$s in each formula may be the same or different and are each a group selected from a hydrogen atom, a hydrocarbon group having 1 to 10 carbon atoms, and organic groups including a halogen, an aryl group such as a phenyl group and a benzyl group, and glycidyl ether.

Among the novolac-type epoxy resins (A1) having a condensed ring aromatic hydrocarbon structure represented by the formula (2), preferred is one in which the condensed ring aromatic hydrocarbon structure is a naphthalene structure. This is preferred because inorganic filler dispersion is excellent; the insulation layer is provided with a smooth surface; and formation of advanced fine wiring, that is, formation of fine wiring lines having a narrower conductor width or a narrower gap width between conductors, is allowed.

Preferably, the epoxy resin (A) used in the present invention has a molecular weight of $5.0 \times 10^3$ or less. Because of this, the resin composition is provided with heat resistance and resistance to thermal degradation, and is improved in the film forming property when forming a resin sheet provided with a substrate and the adhesion to an inner layer circuit board when producing a multilayer printed wiring board. In terms of moldability, the epoxy resin (A) used in the present invention preferably has a molecular weight of $1.0 \times 10^3$ or less and $2.0 \times 10^2$ or more.

The content of the epoxy resin is not particularly limited; however, it is preferably 5 to 80% by weight of the total solid content of the resin composition. In the case where the resin composition contains an inorganic filler, the content of the epoxy resin is preferably 5 to 60% by weight of the total solid content of the resin composition.

The content of the epoxy resin is more preferably 10 to 50% by weight of the total solid content of the resin composition, particularly preferably 10 to 30% by weight.

When the content of the epoxy resin is less than the lower limit, the effect of increasing hygroscopic solder heat resistance and adhesion may be decreased. It is not preferable that the content exceeds the upper limit because there may be a case where the dispersibility of the resin composition is deteriorated, the heat resistance of the same is decreased, or the reliability of the resulting product is decreased. By setting the content of the epoxy resin within the above range, an excellent balance between these characteristics is provided to the resin composition.

When contained in a specific amount of 10 to 30% by weight of the total solid content of the epoxy resin composition, the phenoxy resin (B) having a bisphenol acetophenone structure represented by the following formula (1) used in the present invention combines with the epoxy resin (A) and the curing agent (C), so that the epoxy resin composition becomes excellent in heat resistance and moisture resistance reliability, obtains a small surface roughness (Ra), and becomes capable of forming advanced fine wiring:

[Chemical formula 5]

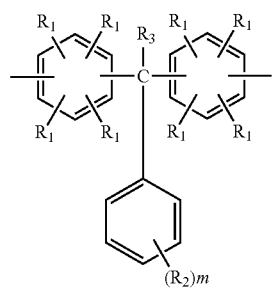

Formula (1)

wherein $R_1$s may be the same or different and are each a group selected from a hydrogen atom, a hydrocarbon group having 1 to 10 carbon atoms, and halogen; $R_2$ is a group selected from a hydrogen atom, a hydrocarbon group having 1 to 10 carbon atoms, and halogen; $R_3$ is a hydrogen atom or a hydrocarbon group having 1 to 10 carbon atoms; and m is an integer of 0 to 5.

Until now, there is the following problem: for example, to form fine wiring by the semi-additive method, it is necessary to decrease the surface roughness (Ra) of the insulation layer subjected to desmear treatment. This is because large convexoconcaves of the insulation layer result in a large difference in the height of conductors formed on the surface of the insulation layer by electroless plating or the like; therefore, at the time of forming circuits by etching, it is difficult to control the etching amount, and due to overage or shortage of the etching amount, it is sometimes impossible to obtain a desired conductor circuit width or to make the width of the gap between conductor circuits a desired width.

To increase heat resistance, it is necessary to increase the glass transition temperature (Tg) of the phenoxy resin used. However, increasing the glass transition temperature is not appropriate for forming fine wiring because, when Tg of the phenoxy resin is increased, due to its rigid structure, the phenoxy resin shows less compatibility with epoxy resins to form a large islands-in-the-sea structure. As a result, a domain of the phenoxy resin, which is to be oxidized and roughened in desmear treatment, grows in size, and the surface roughness (Ra) is increased. As just described, until now, there is a problem with achieving a balance between the compatibility of the phenoxy resin and increasing the glass transition temperature of the same.

In this respect, compared with a conventional phenoxy resin having a bisphenol A, F or S structure, the phenoxy resin having a bisphenol acetophenone structure represented by the above formula (1) used in the present invention (hereinafter simply referred to as "phenoxy resin (B)") has a bulkier structure in its polymer chain, so that the phenoxy resin (B) is excellent in solubility in solvents and compatibility with thermosetting resin components such the epoxy resin to be mixed. Furthermore, the phenoxy resin (B) used in the present invention has high thermal shock resistance and stress-relaxation properties. Accordingly, it is estimated that in the present invention, especially because the phenoxy resin (B) is contained in a specific amount of 10 to 30% by weight of the total solid content of the epoxy resin composition, it combines with the epoxy resin (A) and the curing agent (C), so that the epoxy resin composition becomes capable of forming a uniformly roughened surface having a low roughness degree and thus becomes excellent in plating adhesion, heat resistance and moisture resistance reliability and capable of forming advanced fine wiring. When the content of the phenoxy resin (B) exceeds the upper limit, high-molecular-weight components in the resin composition is increased, so that the thermal expansion coefficient of the insulation resin layer is increased or the crosslink density of the same is decreased, and a problem with reliability may occur. The content less than the lower limit is not preferable because when the resin composition is provided with insufficient curing properties, the mechanical strength of the insulation resin layer is decreased or the plating adhesion of the same is significantly reduced during desmear treatment.

As the hydrocarbon group having 1 to 10 carbon atoms at $R_1$, $R_2$ and $R_3$, there may be mentioned a linear, branched or cyclic alkyl group, an aryl group, etc. For example, there may be mentioned a methyl group, an ethyl group, a n-propyl group, an isopropyl group, a n-butyl group, an isobutyl group, a sec-butyl group, a tert-butyl group, a pentyl group, a hexyl group, a heptyl group, a nonyl group, a decyl group, a cyclopentyl group, a cyclohexyl group, a cycloheptyl group, a phenyl group, a tolyl group and a naphthyl group. The hydrocarbon group is not limited to these examples, however.

As the halogen at $R_1$ and $R_2$, there may be mentioned fluorine, chlorine, bromine, etc.

The phenoxy resin (B) can be synthesized by a conventionally-known method such as a method for polymerizing an epoxy resin and a phenolic resin comprising a bisphenol acetophenone as an essential component by using a catalyst. In the synthesis, a bisphenol acetophenone which has an appropriate substituent and is able to induce a bisphenol acetophenone structure represented by the above formula (1) is used.

To alternately polymerize the epoxy resin and the phenolic resin, the feed ratio (epoxy equivalent:phenolic hydroxyl) is preferably 1.1 to 1.5:0.9 to 0.5, more preferably 1.2 to 1.3:0.8 to 0.7.

The epoxy resin is not particularly limited, and examples thereof include a bisphenol-type epoxy resin such as a bisphenol A-type epoxy resin, a bisphenol F-type epoxy resin, a bisphenol S-type epoxy resin, a bisphenol E-type epoxy resin, a bisphenol M-type epoxy resin, a bisphenol P-type epoxy resin and a bisphenol Z-type epoxy resin; a novolac-type epoxy resin such as a phenol novolac-type epoxy resin and a cresol novolac epoxy resin; and an epoxy resin such as a biphenyl-type epoxy resin, a biphenyl aralkyl-type epoxy resin, an arylalkylene-type epoxy resin, a naphthalene-type epoxy resin, an anthracene-type epoxy resin, a phenoxy-type epoxy resin, a dicyclopentadiene-type epoxy resin, a norbornene-type epoxy resin, an adamantane-type epoxy resin and a fluorene-type epoxy resin.

These resins may be used solely or in combination of two or more.

A phenolic resin that may be contained in addition to the bisphenol acetophenone is not particularly limited. Example thereof include a novolac-type phenolic resin such as a phenol novolac resin, a cresol novolac resin, a bisphenol A novolac resin and an arylalkylene-type novolac resin; and a resol-type phenolic resin such as an unmodified resol phenolic resin and an oil-modified resol phenolic resin modified with wood oil, linseed oil, walnut oil or the like. These resins may be used solely or in combination of two more kinds that have different weight average molecular weights, or one or more kinds of these resins may be used in combination with a prepolymer(s) thereof. Among them, an aryl alkylene-type phenolic resin is particularly preferred. These resins can further increase the hygroscopic solder heat resistance of the resin composition.

The above-mentioned catalyst is not particularly limited as long as it is a compound which has a catalytic ability that promotes the reaction of an epoxy resin with a phenolic resin or with an alcoholic hydroxyl group or a carboxyl group which is produced by the reaction of an epoxy group with a phenolic hydroxyl group. For example, there may be mentioned an alkali metal compound, an organic phosphorus compound, a tertiary amine, a quaternary ammonium salt, cyclic amines and imidazoles. Specific examples of the alkali metal compound include an alkali metal hydroxide such as sodium hydroxide, lithium hydroxide and potassium hydroxide; an alkali metal salt such as sodium carbonate, sodium bicarbonate, sodium chloride, lithium chloride and potassium chloride; an alkali metal alkoxide such as sodium methoxide and sodium ethoxide; alkali metal phenoxide; sodium hydride; lithium hydride; and an alkali metal salt of an organic acid such as sodium acetate and sodium stearate. They may be used solely or in combination of two or more. Among them, a quaternary ammonium salt is particularly preferred. Among quaternary ammonium salts, preferred are tetramethylammonium chloride, tetramethylammonium bromide, tetrabutylammonium chloride, tetrabutylammonium bromide and tetramethylammonium para-toluenesulfonic acid.

Normally, the used amount of the catalyst is 0.001 to 1% by weight of the reactive solid content. In the case of using an alkali metal compound as the catalyst, the total of the contents of Li, Na and K in the phenoxy resin is preferably 5 ppm or less, more preferably 4 ppm or less, and still more preferably 3 ppm or less because the alkali metal component remains in the phenoxy resin and deteriorates the insulating properties of a printed wiring board produced by using the alkali metal compound. When the total exceeds 5 ppm, the insulating properties are deteriorated, so that this is not preferable. In the case of using an organic phosphorus compound as the catalyst, the compound remains in the phenoxy resin as a catalyst residue and deteriorates the insulating properties of a printed wiring board, so that the phosphorus content in the phenoxy resin is preferably 150 ppm or less, more preferably 140 ppm or less, still more preferably 100 ppm or less. When the content exceeds 150 ppm, the insulating properties are deteriorated, so that this is not preferable.

A solvent may be used in a synthesis reaction step for producing the phenoxy resin (B). As the solvent, any solvent may be used as long as it can dissolve phenoxy resins and has no adverse affects on the reaction. The solvent is not particularly limited, and there may be mentioned, for example, an aromatic hydrocarbon, ketones, an amide-based solvent, glycol ethers, etc. Specific examples of the aromatic hydrocarbon include toluene and xylene. As the ketones, there may be mentioned acetone, methyl ethyl ketone, methyl isobutyl ketone, 2-heptanone, 4-heptanone, cyclohexanone, acetylacetone, dioxane, etc. Specific examples of the amide-based solvent include formamide, N,N-dimethylformamide, acetamide, N,N-dimethylacetamide, 2-pyrrolidone and N-methylpyrrolidone. Specific examples of the glycol ethers include ethylene glycol monomethyl ether, ethylene glycol monoethyl ether, ethylene glycol mono-n-butyl ether, ethylene glycol monoethyl ether acetate, diethylene glycol monomethyl ether, diethylene glycol mono-n-butyl ether, diethylene glycol dimethyl ether, diethylene glycol monoethyl ether acetate, propylene glycol monomethyl ether and propylene glycol mono-n-butyl ether. These solvents may be used solely or in combination of two or more. The amount of the used solvent may be appropriately determined based on the reaction condition. For example, in the case of two-step production, it is preferable to control the amount so that the solid concentration reaches 35% to 95%. The reaction temperature has to be within the range in which the used catalyst is not degraded. The reaction temperature is preferably 50 to 230° C., more preferably 120 to 200° C. In the case of using a solvent having a low boiling point, such as acetone or methyl ethyl ketone, it is possible to obtain such a reaction temperature by performing the reaction in an autoclave under high pressure.

The phenoxy resin (B) may also have a structure other than the bisphenol acetophenone structure of the formula (1), and the structure is not particularly limited. As the structure, for example, there may be mentioned a bisphenol A-type structure, a bisphenol F-type structure, a bisphenol S-type structure, a biphenyl-type structure, a phenol novolac-type structure and a cresol novolac-type structure. Among them, a biphenyl-type structure is preferable because the phenoxy resin (B) having a biphenyl-type structure is provided with a high glass transition temperature and a low linear thermal expansion coefficient.

From the viewpoint of heat resistance, the glass transition temperature of the phenoxy resin (B) is preferably 120° C. or more, more preferably 130° C. or more. Herein, the glass transition temperature can be measured by differential scanning calorimetry (DSC). For example, there may be used a value which is measured by using a differential scanning calorimetry device ("DSC2920" manufactured by TA Instruments) under a nitrogen atmosphere (30 ml/min) and at a heating rate of 10° C./min. In the present invention, as shown in FIG. 1, tangents are drawn to a DSC curve before and behind the glass transition temperature, and the intersection of the tangents is determined as the glass transition temperature (Tg).

No particular limitation is imposed on the content of the bisphenol acetophenone structure of the formula (1) in the phenoxy resin (B); however, the content is preferably 5% by mole or more and 95% by mole or less, more preferably 10% by mole or more and 85% by mole or less, and still more preferably 15% by mole or more and 75% by mole or less. When the content is less than the lower limit, the resin composition may not be provided with the effect of increasing heat resistance and moisture resistance reliability. When the content exceeds the upper limit, the resin composition could be provided with poor solubility in solvents, so that this is not preferable.

The weight average molecular weight of the phenoxy resin (B) is not particularly limited; however, it is preferably $5.0 \times 10^3$ to $1.0 \times 10^5$, more preferably $1.0 \times 10^4$ to $7.0 \times 10^4$, most preferably $2.0 \times 10^4$ to $5.0 \times 10^4$. When the weight average molecular weight is more than the upper limit, the compatibility of the resin composition with other resins or the solubility of the same in solvents could be significantly deteriorated, so that this is not preferable. When the weight average molecular weight is less than the lower limit, the film forming property of the resin composition could be deteriorated and a problem arises at the time of producing a multilayer printed wiring board, so that this is not preferable. In the present invention, "weight average molecular weight" refers to a polystyrene equivalent molecular weight measured by gel permeation chromatography.

In the present invention, the content of the phenoxy resin (B) is 10 to 30% by weight of the total solid content of the resin composition. The content is preferably 10 to 25% by weight, and more preferably 10 to 20% by weight. In this case, the insulation resin layer is provided with an excellent balance between mechanical strength, plating adhesion to conductor circuits, thermal expansion coefficient and heat resistance, and the insulation resin layer is also provided with excellent moisture resistance reliability. The content of the phenoxy resin (B) is particularly preferably 10 to 15% by weight of the total solid content of the resin composition.

As the curing agent (C) used in the present invention, one which can be used as a curing agent or curing accelerator for epoxy resins may be appropriately used. As the curing agent (C) used in the present invention, for example, there may be mentioned a phenolic curing agent and various kinds of curing accelerators, and they may be used solely or as a mixture of two or more.

The phenolic curing agent is not particularly limited. For example, there may be mentioned well-known and commonly-used ones such as a phenol novolac resin, an alkylphenol novolac resin, a bisphenol A novolac resin, a dicyclopentadiene-type phenolic resin, terpene-modified phenolic resin and polyvinyl phenols, and they may be used solely or in combination of two ore more. Use of a phenolic curing agent increases flame resistance and adhesion.

The curing accelerator is not particularly limited. For example, there may be mentioned a curing accelerator of an epoxy resin such as an imidazole compound, triphenylphosphine or a triphenylphosphine derivative; a cyanate curing catalyst of an organic metal salt such as zinc naphthenate, cobalt naphthenate, tin octylate, cobalt octylate, bisacetylacetonato cobalt(II), and trisacetylacetonato cobalt(III); tertiary amines such as triethylamine, tributylamine and diazabicyclo [2,2,2]octane; a phenolic compound such as phenol, bisphenol A and nonyl phenol; an organic acid such as an acetic acid, a benzoic acid, a salicylic acid and a para-toluenesulfonic acid; and a mixture thereof. They and their derivatives may be used solely or in combination of two or more.

Among the curing accelerators, it is particularly preferable to use an imidazole compound. More preferred is an imidazole compound that is compatible with a resin component contained in the resin composition. Use of such an imidazole compound efficiently promotes the reaction of the epoxy resin, and the epoxy resin composition can the same property can be obtained even in the case where the amount of such an imidazole compound is small. In addition, the resin composition prepared by using such an imidazole compound can be highly uniformly cured between resin components in minute matrix scales. Because of this, it is possible to increase the insulating properties and heat resistance of the insulation layer formed on a multilayer printed wiring board.

As the imidazole compound, for example, there may be used 1-benzyl-2-methylimidazole, 1-benzyl-2-phenylimidazole, 2-phenyl-4-methylimidazole, 2-ethyl-4-methylimidazole, 2,4-diamino-6-[2'-methylimidazolyl-(1')]-ethyl-s-triazine, 2,4-diamino-6-(2'-undecylimidazolyl)-ethyl-s-triazine, 2,4-diamino-6-[2'-ethyl-4-methylimidazolyl-(1')]-ethyl-s-triazine.

Among them, preferred is an imidazole compound selected from 1-benzyl-2-methylimidazole, 1-benzyl-2-phenylimidazole and 2-ethyl-4-methylimidazole. These imidazole compounds have particularly excellent compatibility, so that a highly uniformly cured product can be obtained, and a fine and evenly roughened surface can be formed on the insulation layer surface; therefore, it becomes easy to form fine conductor circuits on the surface of the insulation resin layer and high heat resistance is imparted to a multilayer printed wiring board.

The content of the curing agent (C) is not particularly limited and is preferably 0.01 to 25% by weight of the total solid content of the resin composition. The amount of the curing agent (C) is appropriately determined depending on the components used.

The phenolic curing agent is not necessarily used in the case where, for example, the resin composition contains the cyanate resin and/or prepolymer thereof (E), which will be described below. Accordingly, a curing agent like the above-mentioned phenolic curing agent is preferably 0 to 25% by weight, more preferably 0 to 15% by weight, of the total solid content of the resin composition.

Compared with curing agents such as the above-mentioned phenolic curing agents, curing accelerators are effective even when added in a small amount. Accordingly, in the case of using a curing accelerator like an imidazole compound as the curing agent (C), the curing accelerator is preferably 0.01 to 5.00% by weight, more preferably 0.05 to 3.00% by weight of the total solid content of the resin composition. Because of this, especially, the heat resistance of the resin composition can be increased.

In particular, a curing accelerator like an imidazole compound is preferably 0.01 to 0.5% by weight, more preferably 0.05 to 0.3% by weight, still more preferably 0.05 to 0.25% by weight of the total solid content of the resin composition.

From the viewpoint of low thermal expansion and mechanical strength, it is preferable that the epoxy resin composition according to the present invention further comprises (D) an inorganic filler. The inorganic filler (D) is not particularly limited, and examples thereof include silicates such as talc, calcined clay, uncalcined clay, mica and glass; oxides such as titanium oxide, alumina, silica and fused silica; carbonates such as calcium carbonate, magnesium carbonate and hydrotalcite; metal hydroxides such as aluminum hydroxide, magnesium hydroxide and calcium hydroxide; sulfates or sulfites such as barium sulfate, calcium sulfate and calcium sulfite; borates such as zinc borate, barium metaborate, aluminum borate, calcium borate and sodium borate; nitrides such as aluminum nitride, boron nitride, silicon nitride and carbon nitride; and titanates such as strontium titanate and barium titanate. They may be used solely or in combination of two or more. Among them, silica is preferred from the viewpoint of thermal expansion characteristics and insulation reliability, and spherical fused silica is more preferred. From the viewpoint of flame resistance, aluminum hydroxide is preferred.

The particle diameter of the inorganic filler (D) is not particularly limited. Either an inorganic filler having a monodisperse average particle diameter or an inorganic filler having a polydisperse average particle diameter may be used. Besides, inorganic fillers having a monodisperse average particle diameter and/or a polydisperse average particle diameter may be used solely or in combination of two or more. Among them, in the case where the width of conductor circuits on a multilayer printed wiring board and the width of the gap between the conductor circuits (L/S) are less than 15 µm each, from the viewpoint of insulation reliability, preferred is an inorganic filler having an average particle diameter of 1.2 µm or less and 0.1 µm or more and containing no coarse particles having a diameter of 5 µm or more. In the case where L/S is 15 µm or more, preferred is an inorganic filler which has an average particle diameter of 5 µm or less and 0.2 µm or more and in which coarse particles having a diameter of 20 µm or more is 0.1% or less. When the average particle diameter is less than the lower limit, the fluidity of the resin composition is significantly deteriorated, so that the moldability of the same may be decreased. When the average particle diameter exceeds the upper limit, insulating properties of conductor circuits may be decreased. Average particle diameter can be measured with a laser diffraction/scattering particle size distribution analyzer (a general device such as "SALD-7000" manufactured by Shimadzu Corporation).

The content of the inorganic filler (D) is not particularly limited and is preferably 10% by weight to 75% by weight, more preferably 10 to 70% by weight, still more preferably 30% by weight to 70% by weight of the total solid content of the resin composition. In the case where the cyanate resin and/or prepolymer thereof (E) is contained in the resin composition, the content of the inorganic filler is preferably 35 to 60% by weight of the total solid content of the resin composition. When the inorganic filler content exceeds the upper limit, there may be an undesirable case that the fluidity of the resin composition is significantly decreased. When the content is less than the lower limit, there may be an undesirable case that the strength of the insulation layer comprising the resin composition is not enough.

The epoxy resin composition of the present invention preferably further comprises the cyanate resin and/or prepolymer thereof (E) from the viewpoint of increasing the heat resistance and flame resistance of the epoxy resin composition. Especially in the case where the cyanate resin and/or prepolymer thereof (E) is contained in the resin composition in combination with the phenoxy resin (B) having a bisphenol acetophenone structure, the resins have excellent compatibility with each other and the resin composition is provided with excellent heat resistance and a low linear expansion coefficient, so that the insulation layer is provided with excellent surface smoothness and excellent desmearing properties. The method for obtaining the cyanate resin and/or prepolymer thereof is not particularly limited, and the cyanate resin and/or prepolymer thereof can be obtained by reacting a halogenated cyanogen compound with a phenol and, when needed, prepolymerizing the reactant by heating, etc. Also, a commercial product produced in this manner can be used.

The type of the cyanate resin is not particularly limited, and there may be mentioned, for example, a novolac-type cyanate resin, a bisphenol-type cyanate resin such as a bisphenol A-type cyanate resin, a bisphenol E-type cyanate resin and a tetramethyl bisphenol F-type cyanate resin.

The cyanate resin and/or prepolymer thereof (E) preferably has two or more cyanate groups (—O—CN) in its molecule. For example, there may be mentioned 2,2'-bis(4-cyanatophenyl)isopropylidene, 1,1'-bis(4-cyanatophenyl)ethane, bis(4-cyanato-3,5-dimethylphenyl)methane, 1,3-bis(4-cyanatophenyl-1-(1-methylethylidene))benzene, a dicyclopentadiene-type cyanate ester, a phenol novolac-type cyanate ester, bis(4-cyanatophenyl)thioether, bis(4-cyanatophenyl)ether, 1,1,1-tris(4-cyanatophenyl)ethane, tris(4-cyanatophenyl)phosphite, bis(4-cyanatophenyl)sulfone, 2,2-bis(4-cyanatophenyl)propane, 1,3-, 1,4-, 1,6-, 1,8-, 2,6- or 2,7-dicyanato naphthalene, 1,3,6-tricyanato naphthalene, 4,4'-dicyanato biphenyl, and a cyanate ester resin obtained by reaction of a phenol novolac- or cresol novolac-type polyhydric phenol with a halogenated cyanogen. Among them, a phenol novolac-type cyanate ester resin has excellent flame resistance and thermal expansion characteristics, and 2,2'-bis (4-cyanatophenyl)isopropylidene and a dicyclopentadiene-type cyanate ester are excellent in crosslink density control and moisture resistance reliability. In the present invention, a phenol novolac-type cyanate ester resin is preferred in terms of thermal expansion characteristics. Also, one or more kinds of cyanate ester resins other than above may be used in combination and no particular limitation is imposed thereon.

In the present invention, the cyanate resin (E) may be used solely or in combination with other cyanate resin (E) having a different weight average molecular weight, or the cyanate resin (E) may be used in combination with a prepolymer thereof.

The prepolymer is normally obtained by, for example, trimerizing the cyanate resin (E) by heating reaction, etc., and is preferably used to control the moldability and fluidity of the resin composition.

The prepolymer is not particularly limited; however, in the case of using a prepolymer having a trimerization rate of 20 to 50% by weight, excellent moldability and fluidity are exhibited.

In the case of using the cyanate resin and/or prepolymer thereof (E), the content is not particularly limited; however, it is preferably 5 to 60% by weight of the total solid content of the resin composition. More preferably, it is 10 to 50% by weight. Because of this, the cyanate resin more efficiently exerts the effect of increasing heat resistance and flame resistance. When the content of the cyanate resin is less than the lower limit, low thermal expansion characteristics may be deteriorated or heat resistance may be decreased. When the content exceeds the upper limit, the strength or mechanical strength of the resin layer may be decreased. The content of the cyanate resin and/or prepolymer thereof (E) is particularly preferably 10 to 20% by weight of the total solid content of the resin composition.

It is particularly preferable that the epoxy resin composition of the present invention comprises (A1) the novolac-type epoxy resin having a condensed ring aromatic hydrocarbon structure, (B) the phenoxy resin having a bisphenol acetophenone structure represented by the above formula (1), (C) the curing agent, (D) the inorganic filler and (E) the cyanate resin and/or prepolymer thereof, wherein the content of the phenoxy resin (B) is 10 to 30% by weight of the total solid content of the resin composition, so that the epoxy resin composition is excellent in fine wiring workability and inter-circuit insulation reliability.

Such a specific combination imparts excellent dispersibility in resins to the inorganic filler, produces no streaky unevenness which is a common phenomenon derived from the inorganic filler, gives uniformity, and provides the insulation layer surface with excellent surface smoothness. It is presumed that because the resin composition is also provided with excellent heat resistance, low thermal expansion and excellent desmearing properties, it is especially excellent in fine wiring workability and inter-circuit insulation reliability.

The epoxy resin composition of the present invention preferably further comprises a poly(meth)acrylic acid ester having a weight average molecular weight of $1.0 \times 10^3$ to $1.0 \times 10^5$. This is because excellent surface smoothness and capability of fine wiring workability are obtained by combining the epoxy resin composition of the present invention to the poly (meth)acrylic acid ester further. Also, use of the poly(meth) acrylic acid ester improves the antifoaming or defoaming properties of the epoxy resin composition, so that it is possible to control the wettability between a film or metal foil and the insulation resin layer.

Preferably used as the poly(meth)acrylic acid ester is one polymerized with a (meth)acrylic acid ester. The (meth) acrylic acid ester is not particularly limited, and examples thereof include ethyl acrylate, butyl acrylate, isopropyl acrylate, 2-ethylhexyl acrylate, isobutyl acrylate, t-butyl acrylate, s-butyl acrylate, cyclohexyl acrylate, octadecyl acrylate, 2-ethoxyethyl acrylate, lauryl acrylate, stearyl acrylate, methyl methacrylate, ethyl methacrylate, isopropyl methacrylate, butyl methacrylate, s-butyl methacrylate, t-butyl methacrylate, cyclohexyl methacrylate, octadecyl methacrylate, 2-ethylhexyl methacrylate, lauryl methacrylate and stearyl methacrylate. These monomers may be used as a homopolymer, a copolymer produced by polymerizing two or more of these monomers, a mixture of two or more polymers each produced by polymerizing as above stated, or a mixture of the polymer with the monomer.

The weight average molecular weight of the poly(meth) acrylic acid ester is $1.0 \times 10^3$ to $1.0 \times 10^5$; however, it is more preferably $3.0 \times 10^3$ to $1.5 \times 10^4$ from the viewpoint of the effect caused by adding the poly(meth)acrylic acid ester. Also, the poly(meth)acrylic acid ester used in the present invention is preferably a polymer of a (meth)acrylic acid alkyl ester, and particularly preferably one having an alkyl carbon number of about 3 to 10.

Among the above, preferred are butyl acrylate, poly(butyl acrylate), a copolymer of butyl acrylate and 2-ethylhexyl acrylate, 2-ethylhexyl acrylate, and poly(2-ethylhexyl acrylate). Also, the poly(meth)acrylic acid ester used in the present invention is preferably such that repeating units derived from butyl acrylate are contained in the poly(meth) acrylic acid ester in an amount of 50.0% by weight or more. In the case where an acrylic surfactant is contained in the resin composition, the content of the acrylic surfactant is preferably 0.1 to 10.0% by weight, more preferably 0.3 to 5.0% by weight of the resin composition. The reason why the preferable content of the acrylic surfactant is in this range is as follows: when the content exceeds the upper limit, the acrylic surfactant is unevenly deposited on the surface of the resulting coating, so that an insulation failure and poor adhesion to conductor circuits may occur; moreover, when the content is less than the lower limit, the resulting coating may have a failure such as cissing or unevenness, so that fine circuit and wiring processing may become difficult and a decrease in productivity may occur.

The epoxy resin composition of the present invention preferably further comprises a coupling agent. The coupling agent is not particularly limited, and examples thereof include silane-based, titanate-based, aluminum-based coupling agents. For example, there may be mentioned an aminosilane compound such as N-phenyl-3-aminopropyltrimethoxysilane, 3-aminopropyltrimethoxysilane, 3-aminopropyltriethoxysilane, 3-(2-aminoethyl)aminopropyltrimethoxysilane, 3-(2-aminoethyl)aminopropyltriethoxysilane, 3-anilinopropyltrimethoxysilane, 3-anilinopropyltriethoxysilane, N-β-(N-vinylbenzylaminoethyl)-3-aminopropyltrimethoxysilane and N-β-(N-vinylbenzylaminoethyl)-3-aminopropyltriethoxysilane; an epoxy silane compound such as 3-glycidoxypropyltrimethoxysilane, 3-glycidoxypropyltriethoxysilane and 2-(3,4-epoxycyclohexyl)ethyltrimethoxysilane; and other coupling agent such as 3-mercaptopropyltrimethoxysilane, 3-mercaptopropyltriethoxysilane, 3-ureidopropyltrimethoxysilane, 3-ureidopropyltriethoxysilane, and 3-methacryloxypropyltrimethoxysilane. These coupling agents may be used solely or in combination of two or more. Use of the coupling agent increases the wettability of an interface between the epoxy resin, the cyanate resin and the inorganic filler. Because of this, heat resistance properties, especially hygroscopic solder heat resistance, are increased.

The content of the coupling agent is not particularly limited; however, it is preferably 0.05 to 5.00 parts by weight with respect to the inorganic filler of 100 parts by weight. It is particularly preferably 0.01 to 2.50 parts by weight. When the content of the coupling agent is less than the lower limit, the effect of increasing the heat resistance by covering the inorganic filler, may be insufficient. On the other hand, when the content exceeds the upper limit, the transverse strength of the insulation resin layer may be decreased. By setting the content of the coupling agent within the above range, an excellent balance between these properties can be obtained.

In addition to the components described above, the epoxy resin composition of the present invention may contain other additives as needed, such as organic particles such as core-shell structured rubber particles and acrylic rubber particles, a silicone-based, fluorine-based or polymeric defoamer and/ or a leveling agent, and a coloring agent such as titanium oxide and carbon black. To increase the various properties of the resin composition (e.g., compatibility with resins, stability and workability), various kinds of additives may be appropriately added to the resin composition, such as an ion scavenger, a non-reactive diluent, a reactive diluent, a thixotropic agent and a thickener.

Hereinafter, the resin sheet of the present invention will be described.

The resin sheet of the present invention is a resin sheet comprising a substrate and a resin layer comprising the epoxy resin composition of the present invention, wherein the resin layer is formed on the substrate.

The resin sheet of the present invention is such that the resin layer comprising the epoxy resin composition of the present invention has an excellent property of filling circuit height differences, an excellent planarizing property after the filling, and excellent laser processability. The resin sheet is laminated on a substrate such as a film or metal foil, so that the resin layer has excellent handling ability and suitability for various kinds of processes.

The method for producing the resin sheet is not particularly limited. For example, a resin varnish is produced by dissolving, mixing and stirring the resin composition in a solvent by using a mixer which employs, for example, an ultrasonic dispersion technique, a high-pressure collision method dispersion technique, a high-speed rotation dispersion technique, a beads mill technique, a high-speed shear dispersion technique, or a rotation and revolution method dispersion technique. The solvent is not particularly limited and may be selected from organic solvents such as alcohols, ethers, acetals, ketones, esters, alcohol esters, ketone alcohols, ether alcohols, ketone ethers, ketone esters and ester ethers.

The solid content of the resin varnish is not particularly limited; however, it is preferably 30 to 80% by weight, particularly preferably 40 to 70% by weight.

Next, the resin varnish is applied to a substrate by a coating device and dried. Alternatively, the resin varnish is sprayed on a substrate by a spray device and dried. The resin sheet can be produced by these methods.

The coating device is not particularly limited and may be, for example, a roll coater, a bar coater, a knife coater, a gravure coater, a die coater, a comma coater and a curtain coater. Among them, methods using a die coater, a knife coater and a comma coater are preferred. Because of this, it is possible to efficiently produce a resin sheet with a substrate, which has no void and in which the resin layer has a constant thickness.

The substrate is not particularly limited, and a film or metal foil is suitably used as the substrate. The film is not particularly limited, and a film comprising a heat-resistant, thermoplastic resin may be used, such as a polyester resin (e.g., polyethylene terephthalate and polybutylene terephthalate), a fluorine resin and a polyimide resin.

The metal foil is not particularly limited. For example, there may be used a metal foil of copper and/or copper alloy, aluminum and/or aluminum alloy, iron and/or iron alloy, silver and/or silver alloy, gold and gold alloy, zinc and zinc alloy, nickel and nickel alloy, tin and tin alloy, or the like.

The thickness of the substrate is not particularly limited; however, one having a thickness of 10 to 70 μm is suitable to use because handling is easy in the production of the resin sheet.

To produce the resin sheet of the present invention, it is preferable that convexoconcaves on the surface of the substrate, which is in contact with the resin layer, are as small as possible. Because of this, the resin layer is provided with excellent plating adhesion to circuits, and fine wiring workability becomes easy.

The thickness of the resin layer of the resin sheet is not particularly limited; however, when the thickness of a multilayer printed wiring board is 1.6 mm, the thickness is preferably 10 to 100 µm, more preferably 20 to 80 µm. When the thickness of a multilayer printed wiring board is 1.8 mm, the thickness of resin layer of the resin sheet is preferably 1 to 60 µm, particularly preferably 5 to 40 µm. To increase the insulation reliability, the thickness of the resin layer is preferably equal to or more than the lower limit. To decrease the thickness of a multilayer printed wiring board, it is preferably equal to or less than the upper limit. Because of this, when producing a printed wiring board, convexoconcaves of inner layer circuits are filled and formed; moreover, a suitable thickness is provided to the insulation resin layer.

Hereinafter, the prepreg of the present invention will be described.

The prepreg of the present invention is a prepreg comprising a glass fiber substrate and the epoxy resin composition of the present invention, wherein the glass fiber substrate is impregnated with the epoxy resin composition.

Because of this, a prepreg which is suitable to produce a multilayer printed wiring board having excellent heat resistance and mechanical strength, is achieved.

As the glass fiber substrate used in the present invention, there may be mentioned a glass woven fabric and a nonwoven glass fabric, for example. Because of this, the strength of the prepreg is increased, and the water absorption of the same is decreased. Also, the linear expansion coefficient of the prepreg is decreased.

As the method for impregnating a glass fiber substrate with the epoxy resin composition of the present invention, there may be mentioned the following methods, for example: a method for preparing a resin varnish as described above and impregnating a fiber substrate with the resin varnish, a coating method using any one of various kinds of coaters, and a spraying method using a spray. Among them, preferred is the method of impregnating a glass fiber substrate with the resin varnish. Because of this, penetration of the resin composition into a glass fiber substrate is increased. To impregnate a glass fiber substrate with the resin varnish, general impregnating and coating facilities can be used.

The solvent used for the resin varnish is desired to show excellent ability to dissolve the resin components in the epoxy resin composition; however, a poor solvent may be used as long as it makes no negative impact. The concentration of nonvolatile components in the resin varnish is not particularly limited; however, it is preferably 40 to 80% by weight, particularly preferably 50 to 65% by weight. Because of this, the viscosity of the resin varnish is set to an appropriate level, so that the penetration of the epoxy resin composition into the glass fiber substrate is increased further. The prepreg is obtained by impregnating the glass fiber substrate with the epoxy resin composition and drying the same at a predetermined temperature such as a temperature of 80 to 200° C.

Hereinafter, the multilayer printed wiring board produced by using the resin sheet of the present invention and the method for producing the same will be described.

The multilayer printed wiring board of the present invention is formed by laminating the resin sheets or prepregs of the present invention on one or both surfaces of an inner layer circuit board and hot-pressing the same.

In particular, the multilayer printed wiring board is obtained in such a manner that the resin side of the resin sheet or prepreg of the present invention is laminated on an inner layer circuit board, hot-pressed in a vacuum using a vacuum-pressure laminator or the like, and then heat-cured using a hot air drier or the like.

The hot-pressing condition is not particularly limited. For example, hot-pressing may be carried out at a temperature of 60 to 160° C. and a pressure of 0.2 to 3 MPa. The heat-curing condition is not particularly limited. For example, heat-curing may be carried out at a temperature of 140 to 240° C. for 30 to 120 minutes.

Alternatively, the multilayer printed wiring board is obtained in such a manner that the resin layer side of the resin sheet or prepreg of the present invention is laminated on an inner layer circuit board and then hot-pressed using a plate press machine or the like. The hot-pressing condition is not particularly limited. For example, hot-pressing may be carried out at a temperature of 140 to 240° C. and a pressure of 1 to 4 MPa.

As the inner layer circuit board used to obtain the multilayer printed wiring board, there may be suitably used an inner layer circuit board which is produced by, for example, forming predetermined conductor circuits on both surfaces of a copper-clad laminate by etching, and performing blackening treatment on the conductor circuit part.

The method for producing a multilayer printed wiring board according to the present invention comprises the steps of successively laminating the resin sheets of the present invention on a surface of an inner layer circuit board, on which an inner layer circuit pattern is formed, and forming a conductor circuit layer by a semi-additive process.

In addition, after curing the resin layer, the film or metal foil is removed from the thus-obtained multilayer printed wiring board, and the resin layer surface is subjected to roughening treatment using an oxidizing agent such as permanganate or bichromate, followed by metal plating, thereby forming conductive wire circuits. In the process of roughening treatment, many fine and highly-uniform convexoconcaves can be formed on the surface of the insulation layer which is formed from the resin sheet of the present invention; moreover, the insulation resin layer surface has high smoothness, so that fine wire circuits can be formed with high accuracy.

Next, the semiconductor device formed by using the multilayer printed substrate of the present invention will be described.

The semiconductor device is produced in such a manner that a semiconductor element is mounted on a high-density multilayer printed wiring board which is produced by the same method as the above-mentioned method for producing the multilayer printed wiring board and which has high-density fine wire circuits formed thereon; thereafter, the element is encapsulated with an encapsulating resin. The method for mounting a semiconductor element and the method for encapsulating the same are not particularly limited. For example, a connecting electrode portion of the multilayer printed wiring board, metal bumps of a semiconductor element are positioned using a flip chip bonder or the like; the solder bumps are heated to their melting point or more with an IR reflow device, hot plate or other heating device so that the solder bumps are fusion bonded to the multilayer printed wiring board for connection; and a liquid sealing resin is filled and cured between the multilayer printed wiring board and the semiconductor element, thereby obtaining a semiconductor device. At the time of manufacturing, the multilayer printed wiring board of the present invention makes fine wiring process easy; therefore, a semiconductor device which has excellent mounting reliability and thermal shock resistance is produced by using the multilayer printed wiring board as a package substrate.

EXAMPLES

Hereinafter, the present invention will be described in detail by way of examples and comparative examples.

Example of Phenoxy Resin Synthesis

Phenoxy resins having a bisphenol acetophenone structure represented by the above-mentioned formula (1) were synthesized in accordance with Patent Literature 2. Synthesis examples are mentioned below; however, the synthesis is not necessarily limited to the method, reaction temperature and reaction time described in the present invention.

Synthesis of Phenoxy Resin A Having a Bisphenol Acetophenone Structure

Into a 1 L reaction container, a tetramethylbiphenyl-type epoxy resin ("YX-4000" manufactured by Japan Epoxy Resins Co., Ltd., epoxy equivalent 185 g/eq) of 100 g, bisphenol acetophenone of 80 g and cyclohexanone of 70 g were charged and stirred to dissolve. Next, a 50 wt % tetramethylammonium chloride solution of 0.4 g was added dropwise, and the mixture was reacted at 180° C. for five hours under a nitrogen atmosphere. After the reaction was completed, the precipitate was filtered and vacuum-dried in a vacuum drier at 95° C. for eight hours, thereby obtaining phenoxy resin A which has a bisphenol acetophenone structure represented by the following structural formula (4), a weight average molecular weight of 38,000 and a glass transition temperature of 130° C.:

[Chemical formula 6]

Formula (4)

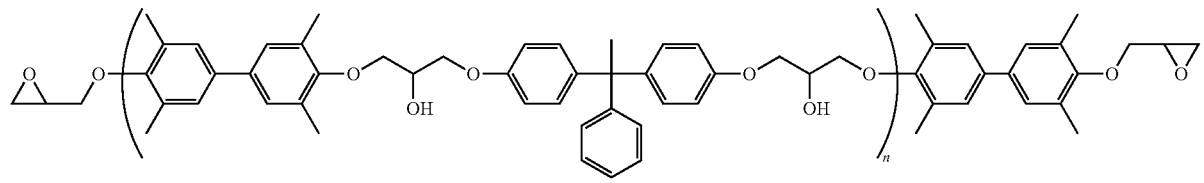

Synthesis of Phenoxy Resin B Having a Bisphenol Acetophenone Structure

Into a 1 L reaction contained, a bisphenol A-type epoxy resin ("jER828" manufactured by Japan Epoxy Resins Co., Ltd., epoxy equivalent 186 g/eq) of 100 g, bisphenol acetophenone of 70 g and cyclohexanone of 70 g were charged and stirred to dissolve. Next, a 50 wt % tetramethylammonium chloride solution of 0.4 g was added dropwise, and the mixture was reacted at 180° C. for five hours under a nitrogen atmosphere. After the reaction was completed, the precipitate was filtered and vacuum-dried in a vacuum drier at 95° C. for eight hours, thereby obtaining phenoxy resin B which has a bisphenol acetophenone structure represented by the following structural formula (5), a weight average molecular weight of 46,000 and a glass transition temperature of 110° C.:

[Chemical formula 7]

Formula (5)

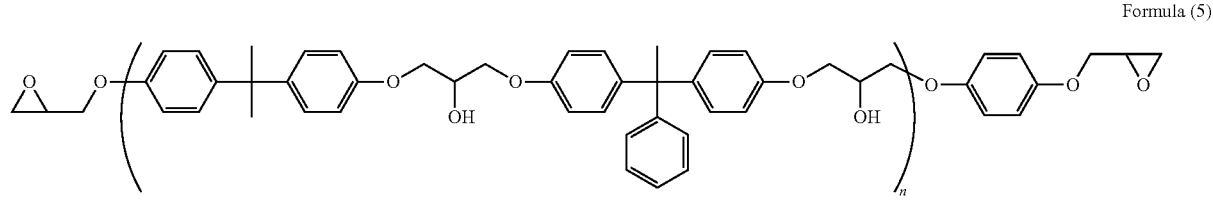

Synthesis of Phenoxy Resin C Having a Bisphenol Acetophenone Structure

Into a 1 L reaction container, a bisphenol F-type epoxy resin ("jER806" manufactured by Japan Epoxy Resins Co., Ltd., epoxy equivalent 168 g/eq) of 100 g, bisphenol acetophenone of 90 g and cyclohexanone of 70 g were-charged and stirred to dissolve. Next, a 50 wt % tetramethylammonium chloride solution of 0.4 g was added dropwise, and the mixture was reacted at 180° C. for five hours under a nitrogen atmosphere. After the reaction was completed, the precipitate was filtered and vacuum-dried in a vacuum drier at 95° C. for eight hours, thereby obtaining phenoxy resin C which has a bisphenol acetophenone structure represented by the following structural formula (6), a weight average molecular weight of 21,000 and a glass transition temperature of 110° C.:

[Chemical formula 8]

Formula (6)

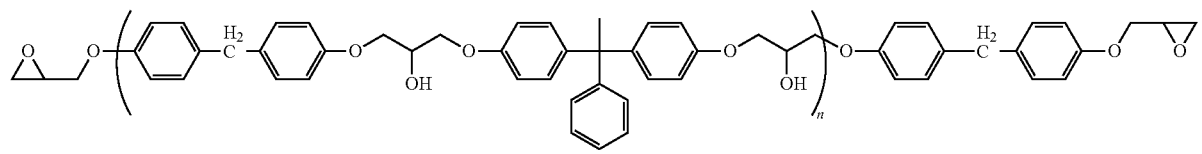

Example Series I

Evaluation of Examples and Comparative Examples was performed by using the thus-obtained phenoxy resins A to C and the following materials:

(1) Epoxy resin A (Tetramethylbiphenyl-type epoxy resin): "YX-4000" manufactured by Japan Epoxy Resins Co., Ltd., epoxy equivalent 185 g/eq
(2) Epoxy resin B (Bisphenol A-type epoxy resin): "jER828" manufactured by Japan Epoxy Resins Co., Ltd., epoxy equivalent 186 g/eq
(3) Epoxy resin C (Bisphenol F-type epoxy resin): "jER806" manufactured by Japan Epoxy Resins Co., Ltd., epoxy equivalent 168 g/eq
(4) Epoxy resin D (Biphenyldimethylene-type epoxy resin): "NC-3000" manufactured by Nippon Kayaku Co., Ltd., epoxy equivalent 275 g/eq
(5) Epoxy resin E (Anthracene-type epoxy resin): "YX-8800" manufactured by Japan Epoxy Resins Co., Ltd., epoxy equivalent 180 g/eq
(6) Epoxy resin F (Novolac-type resin having a naphthalene structure): "HP-5000" manufactured by DIC Corporation, epoxy equivalent 250 g/eq
(7) Phenoxy resin D (Copolymer of a bisphenol A-type epoxy resin and a bisphenol F-type epoxy resin, which has an epoxy group at both terminals thereof): "jER4275" manufactured by Japan Epoxy Resins Co., Ltd., weight average molecular weight 60,000
(8) Phenoxy resin E (Copolymer of a biphenyl-type epoxy resin and a bisphenol S-type epoxy resin, which has an epoxy group at both terminals thereof): "YX8100" manufactured by Japan Epoxy Resins Co., Ltd., weight average molecular weight 25,000
(9) Cyanate resin (Novolac-type cyanate resin): "Primaset PT-30" manufactured by Lonza Japan Ltd., weight average molecular weight 700
(10) Phenolic curing agent (Biphenylalkylene-type novolac resin): "MEH-7851-3H" manufactured by Meiwa Plastic Industries, Ltd., hydroxyl equivalent 220 g/eq
(11) Curing accelerator (Imidazole compound): "Curezol 1B2PZ (1-benzyl-2-phenylimidazole)" manufactured by Shikoku Chemicals Corporation
(12) Inorganic filler: "SO-25H" manufactured by Admatechs Co., Ltd., average particle diameter 0.5 μm
(13) Acrylic rubber particles: "W450A" manufactured by Mitsubishi Rayon Co., Ltd., average particle diameter 0.5 μm
(14) Polyacrylic acid ester: "BYK350" manufactured by BYK-Chemie Japan KK., weight average molecular weight 8,000 to 15,000

Example I-1

(1) Production of Resin Varnish

Epoxy resin D of 30.0 parts by weight, phenoxy resin A of 15 parts by weight, the cyanate resin of 19.8 parts by weight and the curing accelerator of 0.2 part by weight were dissolved and dispersed in methyl ethyl ketone. Furthermore, the inorganic filler of 35.0 parts by weight was added thereto, and the mixture was stirred for 10 minutes by means of a high speed stirring device, thereby producing a resin varnish having a solid content of 60% by weight.

(2) Production of Resin Sheet

A polyethylene terephthalate film ("SFB38" manufactured by Mitsubishi Polyester Film Corp.) was used as the substrate, and the resin varnish obtained above was applied to the film by means of a comma coater so that the resulting insulation film (resin layer) has a thickness of 40 μm when dried. The film was dried with a drier at 150° C. for five minutes, thereby producing a resin sheet with a substrate.

(3) Production of Multilayer Printed Wiring Board

An inner layer circuit board having predetermined inner layer circuits formed on both surfaces thereof was prepared. The above-obtained resin sheet with the substrate was laminated on both surfaces of the inner layer circuit board each so that the resin sheet side of the resin sheet faces inward. The resultant was hot-pressed in a vacuum by means of a vacuum-pressure laminating machine at a temperature of 100° C. and a pressure of 1 MPa. Then, the substrate was removed from the resin sheet, and the resin sheet was cured by heating with a hot air drier at 170° C. for 60 minutes, thereby obtaining a laminate.

As the inner layer circuit board, the following materials were used:

Insulation layer: Halogen-free FR-4, thickness 0.4 mm
Conductor layer: Copper foil, thickness 18 μm, L/S=120/180 μm, clearance holes 1 mmφ and 3 mmφ, slit 2 mm Next, for interlayer connection, via holes (φ60 μm) were formed at predetermined positions of the laminate with carbon dioxide laser.

Then, the laminate was immersed in a swelling solution ("Swelling Dip Securiganth P" manufactured by Atotech Japan) at 70° C. for five minutes and then immersed in a potassium permanganate aqueous solution ("Concentrate compact CP" manufactured by Atotech Japan) at 80° C. for 20 minutes. The laminate was neutralized after the immersion, and desmear treatment was performed on the inside of the via holes.

After the desmear treatment, the laminate underwent the processes of degreasing, adding a catalyst, and activation. Then, an electroless copper plating film having a thickness of about 1 μm was formed thereon. After this, a resist layer for electrolytic copper plating was formed so as to have a thickness of 20 μm, and exposed to light through a predetermined circuit pattern, followed by removal of an unexposed part. Next, etching was performed on a copper-plated part which was not covered with the resist layer, thereby forming a circuit pattern. Furthermore, electrolytic copper plating was performed thereon to increase the thickness of the circuit pattern. After this, the laminate was post-cured by heating at a temperature of 200° C. for 60 minutes to cure the insulation resin layer. Then, the resist layer was removed, and a pattern (L/S=20/20 μm) was formed by flash etching the whole surface. In addition to this pattern (L/S=20/20 μm), a pattern having a circuit height of 10 μm and L/S=10/10 μm, and a pattern having a circuit height of 8 μm and L/S=8/8 μm were formed.

Finally, a solder resist ("PSR4000/AUS308" manufactured by Taiyo Ink Mfg., Co., Ltd.) was formed on the circuit surface so as to have a thickness of 20 μm, and a connecting electrode portion was exposed by exposure to light and development so that a semiconductor element can be mounted. The resultant was heated at a temperature of 180° C. for 60 minutes to cure the solder resist, subjected to nickel-gold plating treatment, and cut into a size of 50 mm×50 mm, thereby obtaining a multilayer printed wiring board.

(5) Production of Semiconductor Device

A semiconductor element (TEG chip having a size of 15 mm×15 mm and a thickness of 0.8 mm) was used, in which a solder bump was formed from a Sn/Pb eutectic and a circuit protecting film was formed from a positive-working photosensitive resin ("CRC-8300" manufactured by Sumitomo Bakelite Co., Ltd.) A semiconductor device was assembled in such a manner that at first, a flux material was evenly applied to the solder bump by a transfer method; next, the semiconductor element was mounted on the multilayer printed wiring board by thermocompression using a flip chip bonder; after the solder bump was fusion bonded in an IR reflow furnace, a liquid sealing resin ("CRP-4152S" manufactured by Sumitomo Bakelite Co., Ltd.) was filled and cured, thereby obtaining a semiconductor device. The liquid sealing resin was cured in the condition of a temperature of 150° C. for 120 minutes.

Example I-2

Epoxy resin D of 25.0 parts by weight, phenoxy resin A of 25.0 parts by weight, the phenolic curing agent of 19.9 parts by weight and the curing accelerator of 0.1 part by weight were dissolved and dispersed in methyl ethyl ketone. Furthermore, the inorganic filler of 30.0 parts by weight was added thereto, and the mixture was stirred for minutes by means of a high speed stirring device, thereby producing a resin varnish having a solid content of 50% by weight.

By using this resin varnish, a resin sheet with a substrate, a multilayer printed wiring board and a semiconductor device were obtained in the same manner as Example I-1.

Example I-3

Epoxy resin A of 8.0 parts by weight, epoxy resin D of 10.0 parts by weight, phenoxy resin A of 12.0 parts by weight, the phenolic curing agent of 9.9 parts by weight and the curing accelerator of 0.1 part by weight were dissolved and dispersed in methyl ethyl ketone. Furthermore, the inorganic filler of 60.0 parts by weight was added thereto, and the mixture was stirred for 10 minutes by means of a high speed stirring device, thereby producing a resin varnish having a solid content of 50% by weight.

By using this resin varnish, a resin sheet with a substrate, a multilayer printed wiring board and a semiconductor device were obtained in the same manner as Example I-1.

Example I-4

Epoxy resin B of 15.0 parts by weight, epoxy resin D of 15.0 parts by weight, phenoxy resin B of 15.0 parts by weight, the cyanate resin of 19.8 parts by weight and the curing accelerator of 0.2 part by weight were dissolved and dispersed in methyl ethyl ketone. Furthermore, the inorganic filler of 35.0 parts by weight was added thereto, and the mixture was stirred for 10 minutes by means of a high speed stirring device, thereby producing a resin varnish having a solid content of 50% by weight.

By using this resin varnish, a resin sheet with a substrate, a multilayer printed wiring board and a semiconductor device were obtained in the same manner as Example I-1.

Example I-5

Epoxy resin C of 14.0 parts by weight, epoxy resin D of 14.0 parts by weight, phenoxy resin C of 15.0 parts by weight, the cyanate resin of 17.8 parts by weight and the curing accelerator of 0.2 part by weight were dissolved and dispersed in methyl ethyl ketone. Furthermore, the inorganic filler of 35.0 parts by weight and the acrylic rubber particles of 4.0 parts by weight were added thereto, and the mixture was stirred for 10 minutes by means of a high speed stirring device, thereby producing a resin varnish having a solid content of 50% by weight.

By using this resin varnish, a resin sheet with a substrate, a multilayer printed wiring board and a semiconductor device were obtained in the same manner as Example I-1.

Comparative Example I-1

Epoxy resin D of 30.0 parts by weight, phenoxy resin D of 15.0 parts by weight, the cyanate resin of 19.8 parts by weight and the curing accelerator of 0.2 part by weight were dissolved and dispersed in methyl ethyl ketone. Furthermore, the inorganic filler of 35.0 parts by weight was added thereto, and the mixture was stirred for 10 minutes by means of a high speed stirring device, thereby producing a resin varnish having a solid content of 50% by weight.

By using this resin varnish, a resin sheet with a substrate, a multilayer printed wiring board and a semiconductor device were obtained in the same manner as Example I-1.

Comparative Example 1-2

Epoxy resin D of 40.0 parts by weight, phenoxy resin A of 5.0 parts by weight, the cyanate resin of 19.8 parts by weight and the curing accelerator of 0.2 part by weight were dissolved and dispersed in methyl ethyl ketone. Furthermore, the inorganic filler of 35.0 parts by weight was added thereto, and the mixture was stirred for 10 minutes by means of a high speed stirring device, thereby producing a resin varnish having a solid content of 50% by weight.

By using this resin varnish, a resin sheet with a substrate, a multilayer printed wiring board and a semiconductor device were obtained in the same manner as Example I-1.

Comparative Example 1-3

Epoxy resin B of 15.0 parts by weight, epoxy resin D of 15.0 parts by weight, phenoxy resin A of 4.0 parts by weight, the phenolic curing agent of 24.4 parts by weight and the curing accelerator of 0.1 part by weight were dissolved and dispersed in methyl ethyl ketone. Furthermore, the inorganic filler of 37.5 parts by weight and the acrylic rubber particles of 4.0 parts by weight were added thereto, and the mixture was stirred for 10 minutes by means of a high speed stirring device, thereby obtaining a resin varnish having a solid content of 50% by weight.

By using this resin varnish, a resin sheet with a substrate, a multilayer printed wiring board and a semiconductor device were obtained in the same manner as Example I-1.

Comparative Example 1-4

Phenoxy resin A of 45.0 parts by weight, epoxy resin D of 10.0 parts by weight, the cyanate resin of 9.8 parts by weight and the curing accelerator of 0.2 part by weight were dissolved and dispersed in methyl ethyl ketone. Furthermore, the inorganic filler of 35.0 parts by weight was added thereto, and the mixture was stirred for 10 minutes by means of a high speed stirring device, thereby obtaining a resin varnish having a solid content of 50% by weight.

By using this resin varnish, a resin sheet with a substrate, a multilayer printed wiring board and a semiconductor device were obtained in the same manner as Example I-1.

Comparative Example 1-5

Phenoxy resin A of 36.0 parts by weight, epoxy resin B of 16.0 parts by weight, epoxy resin D of 18.0 parts by weight, the phenolic curing agent of 29.9 parts by weight and the curing accelerator of 0.1 part by weight were dissolved and dispersed in methyl ethyl ketone. The mixture was stirred for 10 minutes by means of a high speed stirring device, thereby obtaining a resin varnish having a solid content of 50% by weight.

By using this resin varnish, a resin sheet with a substrate, a multilayer printed wiring board and a semiconductor device were obtained in the same manner as Example I-1.

Comparative Example 1-6

Phenoxy resin A of 6.0 parts by weight, epoxy resin E of 20 parts by weight, the cyanate resin of 34.0 parts by weight and the curing accelerator of 0.2 part by weight were dissolved and dispersed in methyl ethyl ketone. Furthermore, the inorganic filler of 40 parts by weight was added thereto, and the mixture was stirred for 10 minutes by means of a high speed stirring device, thereby obtaining a resin varnish having a solid content of 50% by weight.

By using this resin varnish, a resin sheet with a substrate, a multilayer printed wiring board and a semiconductor device were obtained in the same manner as Example I-1.

Comparative Example 1-7

Phenoxy resin E of 6.0 parts by weight, epoxy resin E of 20 parts by weight, the cyanate resin of 34.0 parts by weight and the curing accelerator of 0.2 part by weight were dissolved and dispersed in methyl ethyl ketone. Furthermore, the inorganic filler of 40 parts by weight was added thereto, and the mixture was stirred for 10 minutes by means of a high speed stirring device, thereby obtaining a resin varnish having a solid content of 50% by weight.

By using this resin varnish, a resin sheet with a substrate, a multilayer printed wiring board and a semiconductor device were obtained in the same manner as Example I-1.

The resin sheets with the substrates, the multilayer printed wiring boards and the semiconductor devices, all of which were obtained in the above-mentioned Examples and Comparative Examples, were evaluated for the properties.

The results are shown in Table 1.

TABLE 1

| | | Example I-1 | Example I-2 | Example I-3 | Example I-4 | Example I-5 | Comparative Example I-1 | Comparative Example I-2 |
|---|---|---|---|---|---|---|---|---|
| Resin Composition | Inorganic Filler | 35.0 | 30.0 | 60.0 | 35.0 | 35.0 | 35.0 | 35.0 |
| | Acrylic Rubber Particles | | | | | 4.0 | | |
| | Epoxy Resin A | | | 8.0 | | | | |
| | Epoxy Resin B | | | | 15.0 | | | |
| | Epoxy Resin C | | | | | 14.0 | | |
| | Epoxy Resin D | 30.0 | 25.0 | 10.0 | 15.0 | 14.0 | 30.0 | 40.0 |
| | Epoxy Resin E | | | | | | | |
| | Phenoxy Resin A | 15.0 | 25.0 | 12.0 | | | | 5.0 |
| | Phenoxy Resin B | | | | 15.0 | | | |
| | Phenoxy Resin C | | | | | 15.0 | | |
| | Phenoxy Resin D | | | | | | 15.0 | |
| | Phenoxy Resin E | | | | | | | |

TABLE 1-continued

|  |  |  |  |  |  |  |  |
|---|---|---|---|---|---|---|---|
|  | Cyanate Resin | 19.8 |  |  | 19.8 | 17.8 | 19.8 | 19.8 |
|  | Phenolic Curing Agent |  | 19.9 | 9.9 |  |  |  |  |
|  | Curing Accelerator | 0.2 | 0.1 | 0.1 | 0.2 | 0.2 | 0.2 | 0.2 |
| Evaluation | (1) Plating Peel Strength (kN/m) | 0.71 | 0.65 | 0.66 | 0.7 | 0.72 | 0.64 | 0.66 |
|  | (2) Reflow Heat Resistance Test | ◉ | ○ | ○ | ◉ | ◉ | Δ | Δ |
|  | (3) Moisture Resistance Reliability Test | ○ | ○ | ○ | ○ | ○ | Δ | Δ |
|  | (4) Thermal Shock Resistance Test | ○ | ○ | ○ | ○ | ○ | x | x |

|  |  | Comparative Example I-3 | Comparative Example I-4 | Comparative Example I-5 | Comparative Example I-6 | Comparative Example I-7 |
|---|---|---|---|---|---|---|
| Resin Composition | Inorganic Filler | 37.5 | 35.0 |  | 40.0 | 40.0 |
|  | Acrylic Rubber Particles | 4.0 |  |  |  |  |
|  | Epoxy Resin A |  |  |  |  |  |
|  | Epoxy Resin B | 15.0 |  | 16.0 |  |  |
|  | Epoxy Resin C |  |  |  |  |  |
|  | Epoxy Resin D | 15.0 | 10.0 | 18.0 |  |  |
|  | Epoxy Resin E |  |  |  | 20.0 | 20.0 |
|  | Phenoxy Resin A | 4.0 | 45.0 | 36.0 | 6.0 |  |
|  | Phenoxy Resin B |  |  |  |  |  |
|  | Phenoxy Resin C |  |  |  |  |  |
|  | Phenoxy Resin D |  |  |  |  |  |
|  | Phenoxy Resin E |  |  |  |  | 6.0 |
|  | Cyanate Resin |  | 9.8 |  | 34.0 | 34.0 |
|  | Phenolic Curing Agent | 24.4 |  | 29.9 |  |  |
|  | Curing Accelerator | 0.1 | 0.2 | 0.1 | 0.2 | 0.2 |
| Evaluation | (1) Plating Peel Strength (kN/m) | 0.68 | 0.49 | 0.18 | 0.64 | 0.68 |
|  | (2) Reflow Heat Resistance Test | x | Δ | x | x | x |
|  | (3) Moisture Resistance Reliability Test | x | x | x | Δ | Δ |
|  | (4) Thermal Shock Resistance Test | x | x | x | x | x |

The evaluation methods are as follows.
(1) Plating Peel Strength

After the desmear treatment, the laminate underwent the processes of degreasing, adding a catalyst, and activation. Then, an electroless copper plating film having a thickness of about 1 μm was formed thereon. After this, a resist layer for electrolytic copper plating was formed so as to have a thickness of 25 μm, and the peel strength of the copper plating film (90° peel strength) was measured in accordance with JIS C-6481.

(2) Reflow Heat Resistance Test

The multilayer printed wiring board for the semiconductor device was used, which had no semiconductor element mounted thereon yet. The board was passed through a reflow furnace at 260° C. to visually check the presence of blister. The board was passed through the reflow furnace 30 times.

The reflow condition is as follows. The heating temperature is gradually increased from a room temperature (25° C.) to 160° C. (50 to 60 seconds). Next, the temperature is increased from 160° C. to 200° C. in 50 to 60 seconds. Then, the temperature is increased from 200° C. to 260° C. in 65 to 75 seconds, and heating (reflow) is continued at a temperature of 260 to 262° C. for 5 to 10 seconds. After this, the temperature is cooled to 30° C. in 15 minutes.

The meaning of the symbols are as follows.
◎: No blister was caused even after 30 times of reflow
○: Blister was caused after 10 to 29 times of reflow
Δ: Blister was caused after 4 to 9 times of reflow
x: Blister was caused after 3 times or less of reflow (3) Moisture Resistance Reliability Test Moisture resistance reliability was evaluated in such a manner that the package substrate for the semiconductor device, on which no semiconductor element was mounted yet, was used; and the package substrate was left under the atmosphere of a temperature of 135° C. and a humidity of 85% for 168 hours to evaluate the insulation resistance of wiring lines with line/space=50 μm/50 μm on the package substrate. As the test, one manufactured by ESPEC Corporation was used.

The meaning of the symbols are as follows.
◎: Excellent (The insulation resistance was $10^8 \Omega$ or more)
Δ: Substantially unusable (The insulation resistance was $10^6 \Omega$ or more and less than $10^8 \Omega$)
x: Unusable (The insulation resistance was less than $10^6 \Omega$)

(4) Thermal Shock Resistance Test

The semiconductor device was subjected to 1,000 cycles of −55° C. for 10 minutes, 125° C. for 10 minutes and −55° C. for 10 minutes at in Fluorinert (trademark) to visually check if there is a crack on the test piece.

The meaning of the symbols are as follows.
○: No crack was generated
x: Cracks were generated The following were obtained in each of Examples I-1 to I-5: a resin composition of the present invention which comprises the phenoxy resin having the bisphenol acetophenone structure represented by the above-mentioned formula (1) of 10 to 30% by weight; a resin sheet with a substrate, which comprising the resin composition; a multilayer printed wiring board; and a semiconductor device.

In Examples I-1 to I-5, a semiconductor device having high plating peel strength and excellent moisture resistance reliability was obtained. In particular, the semiconductor device of the present invention was found to have excellent thermal shock resistance.

In Comparative Example I-1, since a phenoxy resin having no bisphenol acetophenone structure represented by the above-mentioned formula (1) was used, the thus-obtained semiconductor device had poor heat resistance and caused problems in the moisture resistance reliability test and the thermal shock resistance test. In Comparative Examples I-2 and I-3, since the content of the phenoxy resin having the bisphenol acetophenone structure represented by the above formula (1) was not enough, the thus-obtained semiconductor device had poor heat resistance and caused blister in the reflow heat resistance test, and the insulation resistance was decreased in the moisture resistance reliability test. In Comparative Examples I-4 and I-5, since the content of the phenoxy resin having the bisphenol acetophenone structure represented by the above formula (1) was excessive, no appropriate desmear roughened surface was obtained. As a result, the plated film was likely to peel off, and no sample was produced which is resistant to the reliability test. In Comparative Examples I-6 and I-7, since the content of the phenoxy resin having the bisphenol acetophenone structure represented by the above formula (1) was not enough, the thus-obtained semiconductor device had poor heat resistance and caused problems in the moisture resistance reliability test and the thermal shock resistance test.

Example I-6

Epoxy resin D of 30.0 parts by weight, phenoxy resin A of 15.0 parts by weight, the cyanate resin of 19.2 parts by weight, the curing accelerator of 0.2 part by weight and the polyacrylic acid ester of 0.6 part by weight were dissolved and dispersed in methyl ethyl ketone. Furthermore, the inorganic filler of 35.0 parts by weight was added thereto, and the mixture was stirred for 10 minutes by means of a high speed stirring device, thereby producing a resin varnish having a solid content of 50% by weight.

By using this resin varnish, a resin sheet with a substrate, a multilayer printed wiring board and a semiconductor device were obtained in the same manner as Example I-1.

Example 1-7

Epoxy resin F of 30.0 parts by weight, phenoxy resin A of 15.0 parts by weight, the cyanate resin of 19.2 parts by weight, the curing accelerator of 0.2 part by weight and the polyacrylic acid ester of 0.6 part by weight were dissolved and dispersed in methyl ethyl ketone. Furthermore, the inorganic filler of 35.0 parts by weight was added thereto, and the mixture was stirred for 10 minutes by means of a high speed stirring device, thereby producing a resin varnish having a solid content of 50% by weight.

By using this resin varnish, a resin sheet with a substrate, a multilayer printed wiring board and a semiconductor device were obtained in the same manner as Example I-1.

The resin sheets obtained in Examples I-6 and I-7 and Comparative Example 1-2 were evaluated for surface roughness of the coated surface and for fine wiring. The results are shown in Table 2. The evaluation methods are as follows.

TABLE 2

|  |  | Example I-6 | Example I-7 | Comparative Example I-2 |
|---|---|---|---|---|
| Resin Composition | Epoxy Resin D | 30.0 |  | 40.0 |
|  | Epoxy Resin F |  | 30.0 |  |
|  | Phenoxy Resin A | 15.0 | 15.0 | 5.0 |
|  | Curing Accelerator | 0.2 | 0.2 | 0.2 |
|  | Inorganic Filler | 35.0 | 35.0 | 35.0 |
|  | Cyanate Resin | 19.2 | 19.2 | 19.8 |
|  | Polyacrylic Acid Ester | 0.6 | 0.6 |  |
| Evaluation | Coated Surface of Resin Sheet (Rz) (μm) | 3.38 | 3.24 | 11.01 |
|  | Property of Forming Fine Wiring (L/S = 20/20) | ◎ | ◎ | ◎ |
|  | Property of Forming Fine Wiring (L/S = 10/10) | ◎ | ◎ | ○ |
|  | Property of Forming Fine Wiring (L/S = 8/8) | ○ | ◎ | Δ |

(1) Ten-Point Average Roughness (Rz)

Ten-point average roughness (Rz) was measured by means of a non-contact, interferometry three-dimensional surface profile measuring device ("WYKO NT1100" manufactured by Veeco Japan). "Rz" used herein is one that is defined in JIS-B0601. Each of the evaluation samples used herein is one that was produced in such a manner that the resin sheet is laminated on both surfaces of a copper-clad laminate each, and after removing the PET substrate from each resin sheet, the resultant was cured at 170° C. for 60 minutes and then roughened by the above-mentioned process.

(2) Fine Wiring Workability

The presence of a short circuit and disconnected wiring line in an outer layer circuit pattern was observed with a metallograph and determined by a continuity test. The shape of the wiring line was observed from a cross-section of the wiring line for evaluation. Measurement was conducted by using the following evaluation samples formed by laser processing: one having an outer layer circuit pattern with L/S=20/20 μm; one having an outer layer circuit pattern with L/S=10/10 μm; and one having an outer layer circuit pattern with L/S=8/8 μm.

The meaning of the symbols are as follows.

◎: Excellent (None of a short circuit, disconnection of wiring lines and peeling was caused, and the circuit shape was normal)

○: Substantially no problem

Δ: Substantially unusable (A failure such as a short circuit, disconnection of wiring lines and peeling was caused)

x: Unusable (A failure such as a short circuit, disconnection of wiring lines or peeling was caused)

Example Series II

Evaluation of Examples and Comparative Examples was performed by using phenoxy resins A to C obtained in the above synthesis examples and the following materials. "Part(s) by weight" of the used resins refers to the resin amount and excludes a solvent, etc.

(1) Epoxy resin A' (Novolac-type epoxy resin having a naphthalene structure): "HP-5000" manufactured by DIC Corporation, epoxy equivalent 250 g/eq
(2) Epoxy resin B' (Cresol novolac-type epoxy resin having a naphthalene structure): "EXA-9900" manufactured by DIC Corporation, epoxy equivalent 270 g/eq
(3) Epoxy resin C' (Bis. A-type epoxy resin): "jER828EL" manufactured by Japan Epoxy Resins Co., Ltd., epoxy equivalent 190 g/eq
(4) Epoxy resin D' (Naphthalene-type epoxy resin): "HP-4032" manufactured by DIC Corporation, epoxy equivalent 151 g/eq
(5) Epoxy resin E' (Naphthalene-type epoxy resin): "HP-4700" manufactured by DIC Corporation, epoxy equivalent 165 g/eq
(6) Epoxy resin F' (Phosphophenanthrene-modified bisphenol A-type epoxy resin): "FX305" manufactured by Tohto Kasei Co., Ltd., epoxy equivalent 504 g/eq
(7) Epoxy resin G' (Phosphophenanthrene-modified phenolic novolac epoxy resin): "FX289ZA" manufactured by Tohto Kasei Co., Ltd., epoxy equivalent 310 g/eq
(8) Phenoxy resin D' (Copolymer of a biphenyl-type epoxy resin and a bisphenol S-type epoxy resin): "YX-8100" manufactured by Japan Epoxy Resins Co., Ltd., weight average molecular weight 40,000, glass transition temperature 150° C.
(9) Phenoxy resin E' (Copolymer of a bisphenol A-type epoxy resin and a bisphenol F-type epoxy resin): "jER4275" manufactured by Japan Epoxy Resins Co., Ltd., weight average molecular weight 60,000, glass transition temperature 75° C.
(10) Phenolic curing agent A': "GPH103" manufactured by Nippon Kayaku Co., Ltd.
(11) Phenolic curing agent B' (Cresol novolac compound having a triazine ring): PHENOLITE "LA-7054" manufactured by DIC Corporation, a solution in a concentration of 60%
(12) Curing accelerator A' (Imidazole compound): "Curezol 1B2PZ" manufactured by Shikoku Chemicals Corporation
(13) Curing accelerator B' (Imidazole compound): "Curezol 2E4MZ" manufactured by Shikoku Chemicals Corporation
(14) Curing accelerator C' (Cyanoethyl imidazole): "2E4MZ-CN" manufactured by Shikoku Chemicals Corporation
(15) Inorganic filler (Spherical silica): "SO-25H" manufactured by Admatechs Co., Ltd., particles having an average particle diameter of 0.5 μm and containing no coarse particles having a diameter of 5 μm or more.
(16) Inorganic filler (Aluminum hydroxide): "HP-360" manufactured by Showa Denko K.K., particles having an average particle diameter of 3.0 μm and containing no fine particles having a diameter of 0.1 μm or less.
(17) Cyanate resin A' (Novolac-type cyanate resin): "Primaset PT-30" manufactured by Lonza Japan Ltd.
(18) Cyanate resin B' (Bis A-type prepolymer): "Primaset BA230" manufactured by Lonza Japan Ltd.
(19) Vinyl acetal: "KS-1" manufactured by Sekisui Chemical Co., Ltd.
(20) Coupling agent (Epoxy silane): "KBM-403E" manufactured by Shin-Etsu Chemical Co., Ltd.
(21) Cyanate catalyst (Cobalt acetylacetonate): "Nacem Cobalt(III) Acetylacetonate" manufactured by Nihon Kagaku Sangyo Co., Ltd.

Example II-1

(1) Production of Resin Sheet

Cyanate resin A' of 30 parts by weight, epoxy resin A' of 50 parts by weight, which is the novolac-type epoxy resin having a condensed ring aromatic hydrocarbon structure, phenoxy resin A having the bisphenol acetophenone structure of 20 parts by weight, which was obtained in the above-mentioned synthesis example, the spherical silica of 70 parts by weight as the inorganic filler, curing accelerator A' of 0.5 part by weight and the coupling agent of 1 part by weight were mixed with and dissolved in methyl ethyl ketone and cyclohexanone. Then, the mixture was stirred for 60 minutes by means of a high speed stirring device, thereby producing a resin varnish having a solid content of 60% by weight. The ratio of the inorganic filler in the resin composition was about 41% by weight.

The resin varnish obtained above was applied onto a polyethylene terephthalate (hereinafter referred to as PET) film by means of a comma coater so that the resulting resin layer has a thickness of 40 μm when dried. The film was dried with a drier at 150° C. for five minutes, thereby producing a resin sheet with the substrate. By using the resin sheet a the substrate, a multilayer printed wiring board and a semiconductor device were obtained in the same manner as Example I-1.

Example II-2

A resin varnish having a solid content of 60% by weight was produced in the same manner as Example II-1 except that phenoxy resin B of 20 parts by weight was used in place of phenoxy resin A.

By using this resin varnish, a resin sheet, a multilayer printed wiring board and a semiconductor device were obtained in the same manner as Example II-1.

Example II-3

A resin varnish having a solid content of 60% by weight was produced in the same manner as Example II-1 except that phenoxy resin C of 20 parts by weight was used in place of phenoxy resin A.

By using this resin varnish, a resin sheet, a multilayer printed wiring board and a semiconductor device were obtained in the same manner as Example II-1.

Example II-4

A resin varnish having a solid content of 60% by weight was produced in the same manner as Example II-3 except that epoxy resin B' of 50 parts by weight was used in place of epoxy resin A' and aluminum hydroxide of 70 parts by weight was used as the inorganic filler in place of the spherical silica.

By using this resin varnish, a resin sheet, a multilayer printed wiring board and a semiconductor device were obtained in the same manner as Example II-1.

Example II-5

A resin varnish having a solid content of 60% by weight was produced in the same manner as Example II-3 except that aluminum hydroxide of 70 parts by weight was used as the inorganic filler in place of the spherical silica.

By using this resin varnish, a resin sheet, a multilayer printed wiring board and a semiconductor device were obtained in the same manner as Example II-1.

Comparative Example II-1

As disclosed in Domestic Re-publication of PCT International Publication for Patent Application No. 03/099952 (Example 1), cyanate resin B' of 45 parts by weight, epoxy resin C' of 30 parts by weight and phenoxy resin D' of 12 parts by weight were mixed with and dispersed in methyl ethyl ketone and cyclohexanone. Furthermore, the inorganic filler of 30 parts by weight was added thereto, and the mixture was stirred for 10 minutes by means of a high speed stirring device, thereby producing a resin varnish having a solid content of 60% by weight. The ratio of the inorganic filler in the resin composition was about 26% by weight.

By using this resin varnish, a resin sheet, a multilayer printed wiring board and a semiconductor device were obtained in the same manner as Example II-1.

Comparative Example II-2

As disclosed in Japanese Patent No. 3104589, cyanate B' of 50 parts by weight, epoxy D' of 50 parts by weight, no phenoxy resin and the cobalt acetylacetonate of 0.01 part by weight were mixed with and dissolved in methyl ethyl ketone and cyclohexanone. Furthermore, the inorganic filler of 70 parts by weight was added thereto, and the mixture was stirred for 10 minutes by means of a high speed stirring device, thereby producing a resin varnish having a solid content of 60% by weight. The ratio of the inorganic filler in the resin composition was about 41% by weight.

By using this resin varnish, a resin sheet, a multilayer printed wiring board and a semiconductor device were obtained in the same manner as Example II-1.

Comparative Example II-3

As disclosed in Japanese Patent Application Laid-Open (JP-A) No. 2007-254710 (Example 5), no cyanate resin, epoxy C' of 28 parts by weight, epoxy E' of 28 parts by weight, no phenoxy, the phenolic curing agent A' (biphenyl dimethylene-type phenolic curing agent "GPH-103" manufactured by Nippon Kayaku Co., Ltd., hydroxyl equivalent 231/eq) of 60 parts by weight, and the curing accelerator ("Curezol 2E4MZ" manufactured by Shikoku Chemicals Corporation) of 0.1 part by weight were dissolved and dispersed in methyl ethyl ketone and cyclohexanone. Furthermore, the inorganic filler of 75 parts by weight and the vinyl acetal of 5 parts by weight were added thereto, and the mixture was stirred for 10 minutes by means of a high speed stirring device, thereby producing a resin varnish having a solid content of 60% by weight. The ratio of the inorganic filler in the resin composition was about 38% by weight.

By using this resin varnish, a resin sheet, a multilayer printed wiring board and a semiconductor device were obtained in the same manner as Example II-1.

Comparative Example II-4

As disclosed in JP-A No. 2008-074929 (Example 5), no cyanate and phenoxy resins, epoxy resins F' and G' (phosphorus-containing epoxies "FX305" and "FX289ZA" manufactured by Tohto Kasei Co., Ltd.) of 80 parts by weight (40 parts by weight each), phenolic curing agent B' (triazine-containing cresol novolac compound PHENOLITE "LA-7054" manufactured by DIC Corporation, a solution in a concentration of 60%, hydroxyl equivalent 125 g/eq) of 20 parts by weight, and curing accelerator C' ("Curezol 2E4MZ-CN" manufactured by Shikoku Chemicals Corporation) of 0.06 part by weight were dissolved and dispersed in methyl ethyl ketone. Furthermore, the inorganic filler of 30 parts by weight was added thereto, and the mixture was stirred for 10 minutes by means of a high speed stirring device, thereby producing a resin varnish having a solid content of 60% by weight. The ratio of the inorganic filler in the resin composition was about 23% by weight.

By using this resin varnish, a resin sheet, a multilayer printed wiring board and a semiconductor device were obtained in the same manner as Example II-1.

Comparative Example II-5

A resin varnish was produced in the same manner as Example II-1, except that phenoxy E' of 20 parts by weight was used. The ratio of the inorganic filler in the resin composition was 41% by weight.

By using this resin varnish, a resin sheet, a multilayer printed wiring board and a semiconductor device were obtained in the same manner as Example II-1.

The resin sheets, the multilayer printed wiring boards and the semiconductor devices, all of which were obtained in the above-mentioned Examples and Comparative Examples, were evaluated for the properties. The results are shown in Tables 3 and 4.

TABLE 3

| | | Example II-1 | Example II-2 | Example II-3 | Example II-4 | Example II-5 | Comparative Example II-1 | Comparative Example II-2 | Comparative Example II-3 | Comparative Example II-4 | Comparative Example II-5 |
|---|---|---|---|---|---|---|---|---|---|---|---|
| (A) | Epoxy Resin A' | 29.1 | 29.1 | 29.1 | | 29.1 | | | | | 29.1 |
| | Epoxy Resin B' | | | | 29.1 | | | | | | |
| | Epoxy Resin C' | | | | | | 25.6 | | 14.2 | | |
| | Epoxy Resin D' | | | | | | | 29.4 | | | |
| | Epoxy Resin E' | | | | | | | | 14.2 | | |
| | Epoxy Resin F' | | | | | | | | | 30.8 | |
| | Epoxy Resin G' | | | | | | | | | 30.8 | |
| (B) | Phenoxy Resin A | 11.7 | | | | | | | | | |
| | Phenoxy Resin B | | 11.7 | | | | | | | | |
| | Phenoxy Resin C | | | 11.7 | 11.7 | 11.7 | | | | | |
| | Phenoxy Resin D' | | | | | | 10.3 | | | | |
| | Phenoxy Resin E' | | | | | | | | | | 11.7 |
| (C) | Phenolic Curing Agent A' | | | | | | | | 30.6 | | |
| | Phenolic Curing Agent B' | | | | | | | | | 15.4 | |
| | Curing Accelerator A' | 0.3 | 0.3 | 0.3 | 0.3 | 0.3 | | | | | 0.3 |
| | Curing Accelerator B' | | | | | | | | 0.1 | | |
| | Curing Accelerator C' | | | | | | | | | 0.1 | |
| (D) | Spherical Silica | 40.8 | 40.8 | 40.8 | | | 25.6 | 41.2 | 38.2 | 23.1 | 40.8 |
| | Aluminum Hydroxide | | | | 40.8 | 40.8 | | | | | |
| (E) | Cyanate Resin A' | 17.5 | 17.5 | 17.5 | 17.5 | 17.5 | | | | | 17.5 |
| | Cyanate Resin B' | | | | | | 38.5 | 29.4 | | | |
| | Vinyl Acetal | | | | | | | 2.7 | | | |
| | Coupling Agent | 0.6 | 0.6 | 0.6 | 0.6 | 0.6 | | | | | 0.6 |
| | Cyanate Catalyst | | | | | | 0.01 | | | | |

TABLE 4

|  | Example II-1 | Example II-2 | Example II-3 | Example II-4 | Example II-5 | Comparative Example II-1 | Comparative Example II-2 | Comparative Example II-3 | Comparative Example II-4 | Comparative Example II-5 |
|---|---|---|---|---|---|---|---|---|---|---|
| (1) Thermal Expansion Coefficient (ppm) | 31 | 30 | 31 | 33 | 32 | 35 | 32 | 46 | 42 | 33 |
| (2) Surface Roughness (Ra) (um) | 0.28 | 0.25 | 0.27 | 0.28 | 0.27 | 0.35 | 0.42 | 0.65 | 0.55 | 0.35 |
| (3) Plating Peel Strength (kN/m) | 0.69 | 0.65 | 0.64 | 0.65 | 0.64 | 0.65 | 0.35 | 0.67 | 0.89 | 0.6 |
| (4) Fine Wiring workability | ◎ | ◎ | ◎ | ○ | ○ | ○ | Δ | x | Δ | Δ |
| (5) Inter-Circuit Insulation Reliability | ◎ | ◎ | ◎ | ○ | ○ | Δ | Δ | x | x | Δ |
| (6) Reflow Mounting Test | ◎ | ◎ | ○ | ○ | ○ | Δ | x | Δ | Δ | ○ |

The evaluation methods are described below.

(1) Thermal Expansion Coefficient

By means of a thermomechanical analyzer (manufactured by TA Instruments), under a nitrogen atmosphere, two measurement cycles were carried out in a tensile mode at a temperature increase rate of 10° C./min, a temperature of 25 to 300° C. and a load of 5 g. The thermal expansion coefficient used herein is an average of linear thermal expansion coefficients obtained at temperatures from 25 to 150° C. in the second cycle.

Measurement was carried out by using evaluation samples, each of which is a resin plate obtained by laminating the insulation resin layer of the resin sheet obtained in each of the above-mentioned Examples and Comparative Examples on another, and heat-curing the same in a drier under a nitrogen atmosphere at 200° C. for one hour.

(2) Surface Roughness

Surface roughness (Ra) was measured by means of a non-contact, interferometry three-dimensional surface profile measuring device ("WYKO NT1100" manufactured by Veeco Japan). "Ra" used herein is one that is defined in JIS-B0601. Each of the evaluation samples used herein is one that was produced in such a manner that the resin sheet is laminated on both surfaces of a copper-clad laminate each, and after removing the PET substrate from each resin sheet, the resultant was cured at 170° C. for 60 minutes and then roughened by the above-mentioned process.

(3) Plating Peel Strength

After the desmear treatment, the laminate underwent the processes of degreasing, adding a catalyst, and activation. Then, an electroless copper plating film having a thickness of about 1 μm was formed thereon. After this, a resist layer for electrolytic copper plating was formed so as to have a thickness of 25 μm, and the peel strength of the copper plating film (90° peel strength) was measured in accordance with JIS C-6481.

(4) Fine Wiring Workability

The presence of a short circuit and disconnected wiring line in an outer layer circuit pattern was observed with a metallograph and determined by a continuity test. The shape of the wiring line was observed from a cross-section of the wiring line for evaluation. Measurement was conducted by using an evaluation sample being formed by laser processing and having an outer layer circuit pattern with L/S=10/10 μm.

The meaning of the symbols are as follows.

◎: Excellent (None of a short circuit, disconnection of wiring lines and peeling was caused, and the circuit shape was normal)

○: Substantially no problem x: Unusable (A failure such as a short circuit, disconnection of wiring lines or peeling was caused)

(5) Inter-Circuit Insulation Reliability (HAST)

Inter-circuit insulation reliability test was conducted under the condition of an impressed voltage of 3.3 VDC, a temperature of 130° C. and a humidity of 85%. Each of the evaluation samples used herein is a printed wiring board in which a resin sheet is further laminated on the above-produced substrate having the pattern (L/S=10/10 μm) formed thereon.

The test was ended when the insulation resistance reached less than $1 \times 10^8$ Ω.

The meaning of the symbols are as follows.

◎: Excellent (500 hours or more)

○: Substantially no problem (200 hours or more and less than 500 hours)

x: Unusable (less than 200 hours)

(6) Reflow Mounting Test

In accordance with IPC/JEDEC J-STD-20, each of the semiconductor devices obtained above was subjected to a reflow at 260° C. three times.

The reflow condition is as follows. The heating temperature is gradually increased from a room temperature (25° C.) to 160° C. (50 to 60 seconds). Next, the temperature is increased from 160° C. to 200° C. in 50 to 60 seconds. Then, the temperature is increased from 200° C. to 260° C. in 65 to 75 seconds, and heating (reflow) is continued at a temperature of 260 to 262° C. for 5 to 10 seconds. After this, the temperature is cooled to 30° C. in 15 minutes.

Evaluation was made by checking the presence of a failure with an ultrasonic flaw detector, such as peeling of the insulation resin layer of the semiconductor device, peeling of the back side of the semiconductor element, and a solder bump defect.

The meaning of the symbols are as follows.

◎: Passed under the condition of level 2a

○: Passed under the condition of level 3 x: A failure was caused under the condition of level 3

As is clear from Tables 3 and 4, an excellent thermal expansion coefficient of around 30 ppm was obtained in Examples II-1 to II-5, so that these examples resulted in excellent mounting reliability. Also in Examples II-1 to II-5, the insulation resin layer obtained an excellent surface roughness (Ra) of less than 0.3 μm. As a result, it is considered that these examples obtained excellent results in forming fine wiring.

Also, because the conductor circuits have small surface roughness, the resin sheet of the present invention is expected to have an excellent high frequency property when it is used in a printer wiring board. Furthermore, Examples II-1 to II-5 have plating peel strengths of 0.6 km/m or more even though they have low roughnesses (Ra).

As is also clear from Examples II-1 to II-5, the resin sheet of the present invention resulted in that the fine wire circuits have a significantly high inter-circuit insulation reliability. Therefore, the resin sheet of the present invention is suitable as a package substrate for a thinned, high-density semiconductor device. Examples II-1 and II-5 achieved excellent results particularly in inter-circuit insulation reliability, and they achieved excellent results particularly in mounting reliability.

On the other hand, as is clear from Tables 3 and 4, Comparative Examples II-1 and II-5 in which none of the phenoxy resins having the bisphenol acetophenone structures was used, have excellent plating peel strength; however, due to having a high surface roughness, they are inferior in forming fine wiring. Comparative Example II-2 in which none of the phenoxy resins was used has an excellent low thermal expansion property; however, due to having a high surface roughness, it is inferior in forming fine wiring. It has a low plating peel strength, so that it is also inferior in mounting reliability. Comparative Examples II-3 and II-4 in which none of the phenoxy resins and the cyanate resins were used are inferior in all of low thermal expansion property, forming fine circuits and inter-circuit insulation reliability.

INDUSTRIAL APPLICABILITY

The epoxy resin composition and resin sheet of the present invention can be suitably used to produce, for example, a printed wiring board which needs to be subjected to microfabrication processing to obtain high density. Also, it is possible to obtain a printed wiring board for electronic instruments that are required to be downsized and to have high speed signal transmission performance and high reliability, which is applicable to a high-density, thinned, highly-reliable semiconductor device.

The invention claimed is:

1. An epoxy resin composition comprising:
(A) an epoxy resin, (B) a phenoxy resin having a bisphenol acetophenone structure represented by the following formula (1) and a weight average molecular weight of $1.0 \times 10^4$ or more, and (C) a curing agent, wherein the content of the phenoxy resin (B) is 10 to 30% by weight of the total solid content of the resin composition:

[Chemical formula 1]

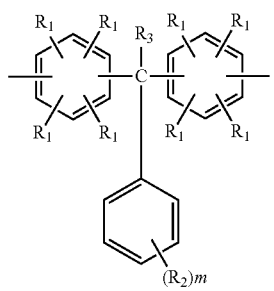

Formula (1)

wherein $R_1$ may be the same or different and are each a group selected from a hydrogen atom, a hydrocarbon group having 1 to 10 carbon atoms, or halogen; $R_2$ is a group selected from a hydrogen atom, a hydrocarbon group having 1 to 10 carbon atoms, or halogen; $R_3$ is a hydrogen atom or a hydrocarbon group having 1 to 10 carbon atoms; and m is an integer of 0 to 5.

2. The epoxy resin composition according to claim 1, further comprising (D) an inorganic filler.

3. The epoxy resin composition according to claim 2, wherein the inorganic filler (D) has a particle diameter of 0.2 μm to 5 μm.

4. The epoxy resin composition according to claim 2, wherein the inorganic filler (D) comprises silica and/or aluminum hydroxide.

5. The epoxy resin composition according to claim 2, wherein, in the total solid content of the resin composition, the content of the epoxy resin (A) is 5 to 60% by weight, the content of the phenoxy resin (B) is 10 to 30% by weight, the content of the curing agent (C) is 0.01 to 15% by weight, and the content of the inorganic filler (D) is 10 to 75% by weight.

6. The epoxy resin composition according to claim 1, further comprising (E) a cyanate resin and/or prepolymer thereof.

7. The epoxy resin composition according to claim 1, wherein the epoxy resin (A) is a novolac-type epoxy resin having a condensed ring aromatic hydrocarbon structure.

8. The epoxy resin composition according to claim 1, further comprising (D) an inorganic filler and (E) a cyanate resin and/or prepolymer thereof, wherein the epoxy resin (A) is (A1) a novolac-type epoxy resin having a condensed ring aromatic hydrocarbon structure.

9. The epoxy resin composition according to claim 8, wherein, in the total solid content of the resin composition, the content of the novolac-type epoxy resin (A1) having a condensed ring aromatic hydrocarbon structure is 10 to 60% by weight; the content of the phenoxy resin (B) is 10 to 30% by weight, the content of the curing agent (C) is 0.01 to 5% by weight; the content of the inorganic filler (D) is 10 to 70% by weight; and the content of the cyanate resin and/or prepolymer thereof (E) is 5 to 60% by weight.

10. The epoxy resin composition according to claim 1, comprising an imidazole compound as the curing agent (C).

11. The epoxy resin composition according to claim 1, further comprising a poly(meth)acrylic acid ester having a weight average molecular weight of $1.0 \times 10^3$ to $1.0 \times 10^5$.

12. The epoxy resin composition according to claim 1, wherein the phenoxy resin (B) having a bisphenol acetophenone structure represented by the above formula (1) further has a biphenyl structure.

13. The epoxy resin composition according to claim 1, wherein the phenoxy resin (B) having a bisphenol acetophenone structure represented by the above formula (1) has a glass transition temperature of 120° C. or more.

14. The epoxy resin composition according to any of claim 1, wherein, in the total solid content of the resin composition, the content of the epoxy resin (A) is 5 to 80% by weight, the content of the phenoxy resin (B) is 10 to 30% by weight, and the content of the curing agent (C) is 0.01 to 25% by weight.

15. A resin sheet comprising a substrate and a resin layer comprising the epoxy resin composition defined in claim 1, wherein the resin layer is formed on the substrate.

16. A method for producing a multilayer printed wiring board comprising the steps of successively laminating the resin sheets defined in claim 15 on a surface of an inner layer circuit board, on which an inner layer circuit pattern is formed, and forming a conductor circuit layer by a semi-additive process.

17. A multilayer printed wiring board formed by laminating the resin sheets defined in claim 15 one or both surfaces of an inner layer circuit board and hot-pressing the same.

18. A semiconductor device formed by mounting a semiconductor element on the multilayer printed wiring board defined in claim 17.

19. A prepreg comprising a glass fiber substrate and the epoxy resin composition defined in claim 1, wherein the glass fiber substrate is impregnated with the epoxy resin composition.

20. A multilayer printed wiring board formed by laminating the prepregs defined in claim 19 on one or both surfaces of an inner layer circuit board and hot-pressing the same.

* * * * *